(12) United States Patent
Kocon

(10) Patent No.: US 11,049,853 B2
(45) Date of Patent: Jun. 29, 2021

(54) ESD PROTECTION DEVICE WITH BREAKDOWN VOLTAGE STABILIZATION

(71) Applicant: Texas Instruments Incorporated, Dallas, TX (US)

(72) Inventor: Christopher Boguslaw Kocon, Mountain Top, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/593,416

(22) Filed: Oct. 4, 2019

(65) Prior Publication Data

US 2021/0104514 A1 Apr. 8, 2021

(51) Int. Cl.
*H01L 27/02* (2006.01)
*H01L 29/40* (2006.01)
*H01L 27/12* (2006.01)
*H01L 29/732* (2006.01)

(52) U.S. Cl.
CPC ...... *H01L 27/0262* (2013.01); *H01L 27/1203* (2013.01); *H01L 29/402* (2013.01); *H01L 29/732* (2013.01)

(58) Field of Classification Search
CPC ............. H01L 27/0647; H01L 27/0262; H01L 29/402
See application file for complete search history.

(56) References Cited

U.S. PATENT DOCUMENTS

| | | | |
|---|---|---|---|
| 2010/0171149 A1* | 7/2010 | Denison | H01L 29/7436 257/173 |
| 2014/0308787 A1 | 10/2014 | Kocon | |
| 2014/0339601 A1* | 11/2014 | Salcedo | H01L 29/7436 257/140 |

* cited by examiner

*Primary Examiner* — Changhyun Yi
(74) *Attorney, Agent, or Firm* — Jacqueline J. Garner; Charles A. Brill; Frank D. Cimino

(57) ABSTRACT

An electronic device includes a silicon-on-insulator (SOI) structure, and an electrostatic discharge (ESD) protection device, with an isolation layer having a thickness and extending in a trench from a first implanted region. The ESD protection device includes a conductive field plate that extends over a portion of the first implanted region and past the first implanted region and over a portion of the isolation layer by an overlap distance that is 3.5 to 5.0 times the thickness of the isolation layer. In one example, the ESD protection device has a finger or racetrack shape, and the first implanted region and a second implanted region extend around first and second turn portions of the finger shape.

20 Claims, 30 Drawing Sheets

ESD PROTECTION DEVICE WITH BREAKDOWN VOLTAGE STABILIZATION

BACKGROUND

Electrostatic discharge (ESD) events can be triggered by human interaction with a circuit board or an included electronic device, such as an integrated circuit (IC), causing high voltages on one or more pads of the IC. If the IC is unprotected, the high pad voltage can lead to undesired current flow through internal circuitry, which can damage or degrade circuit components of the IC. Accordingly, many ICs include protection devices or circuits to provide discharge paths between one or more pads and a ground terminal, power terminal, or other reference node. ESD protection devices or circuits may be provided to protect power supply terminals, as well as to protect I/O terminals and other external connections that may be subjected to ESD events. Ideally, the breakdown voltage (BV) rating or triggering threshold of an ESD protection device is tailored to the voltage rating of the protected circuitry and is stable for different operating conditions of the electronic device. Early latch-up of ESD protection devices is desired as it lowers silicon temperature and enhances current conduction. Non uniform latch-up can lead to creation of hot spots, very low ESD rating and poor reliability. However, the lower or handle substrate of an IC made from a silicon-on-insulator (SOI) starting structure may be biased relative to the top side during operation, which can lead to breakdown voltage variation. In addition, ESD protection devices operate and conduct max current in latch-up in response to ESD events that meet or exceed the breakdown voltage. A high ESD current rating is desired to reduce the size and cost of an ESD protected product, but a bias voltage on the handle substrate can lower the ESD current rating.

SUMMARY

An electronic device with an SOI structure includes an ESD protection device, with an isolation layer that extends in a trench from a first implanted region. The ESD protection device includes a field plate that extends over a portion of the first implanted region past the first implanted region and over a portion of the isolation layer by an overlap distance that is tailored to the thickness of the isolation layer to mitigate breakdown voltage variation with handle substrate biasing. In one example, the ESD protection device has a finger or racetrack shape, where the first implanted region and a second implanted region extend around first and second turn portions of the finger shape. In one example, the ESD protection device includes a second isolation layer that extends in the first implanted region, spaced apart from the first isolation layer, and having a length along the first direction tailored to mitigate ESD current rating degradation.

DETAILED DESCRIPTION

Figure 1:
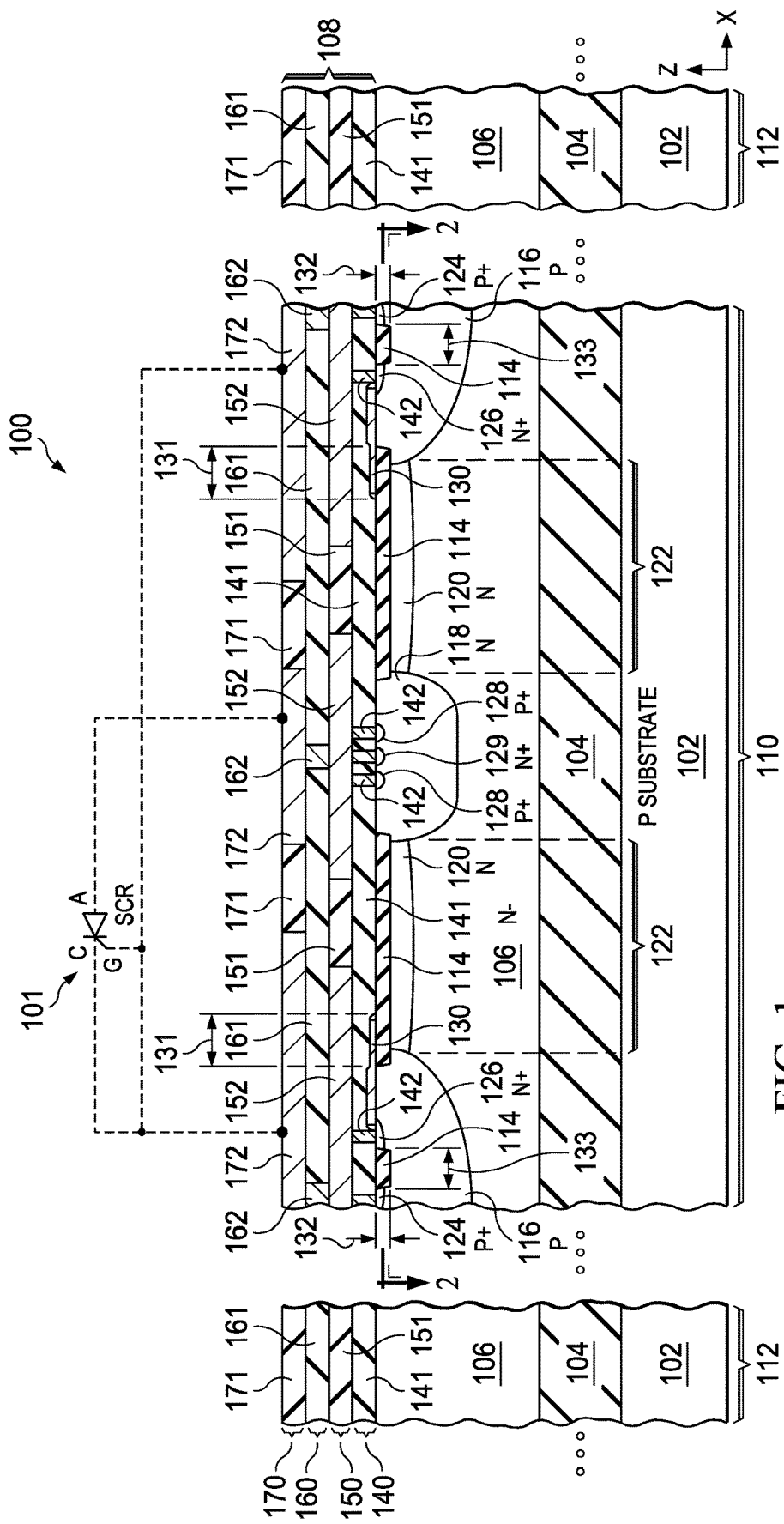
FIG. 1 is a partial sectional side elevation view of an integrated circuit (IC) electronic device with a silicon controlled rectifier (SCR) ESD protection device.

In the drawings, like reference numerals refer to like elements throughout, and the various features are not necessarily drawn to scale. One or more operational characteristics of various circuits, systems and/or components are hereinafter described in the context of functions which in some cases result from configuration and/or interconnection of various structures when circuitry is powered and operating.

Figure 2:
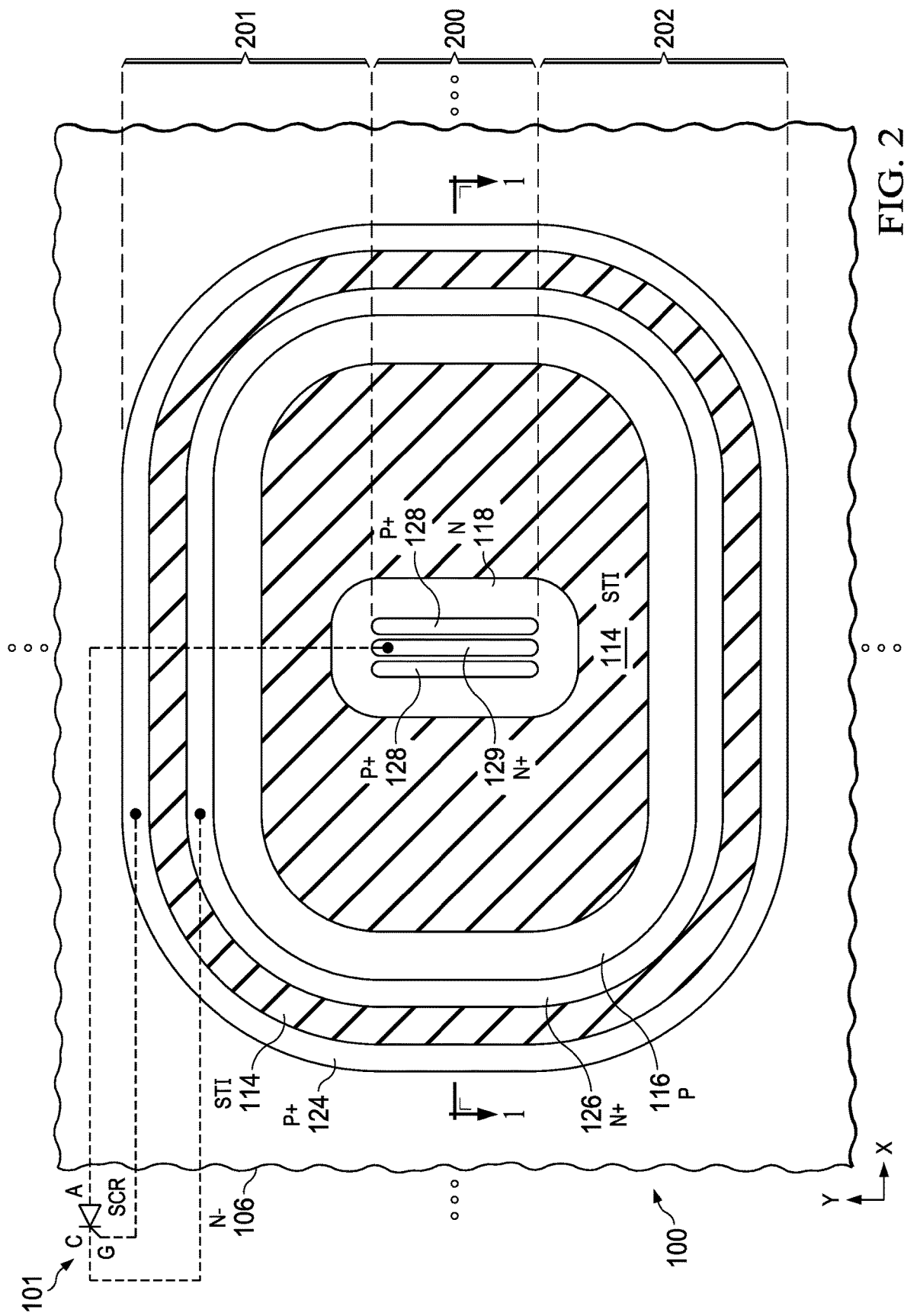
FIG. 2 is a partial sectional top plan view of the SCR ESD protection device taken along line 2-2 in FIG. 1.

FIGS. 1 and 2 show respective sectional side and top views of an integrated circuit (IC) electronic device 100 with an SCR type ESD protection device 101. The SCR 101 is schematically shown in the drawings, and includes an anode labeled "A", a cathode labeled "C", and a gate labeled "G". FIG. 2 shows the sectional top plan view of a portion of the SCR ESD protection device 101 taken along line 2-2 in FIG. 1, and FIG. 1 shows a partial sectional side view taken along line 1-1 in FIG. 2. As shown in FIG. 1, the electronic device 100 includes an SOI structure with a semiconductor substrate 102 (e.g., silicon) having a first (e.g., bottom) side and an opposite second (e.g., top) side. In one example, the semiconductor substrate 102 is doped with n-type dopants, such as phosphorus (e.g., labeled "N+" in FIG. 1). The SOI structure also includes an insulator layer 104, such as silicon dioxide ($SiO_2$) with opposite first and second (e.g., bottom and top) sides, where the bottom or first side of the insulator layer 104 is disposed along the top or second side of the semiconductor substrate 102. In addition, the SOI structure includes an upper semiconductor layer 106 (e.g., silicon), with opposite first and second (e.g., bottom and top) sides. The first side of the semiconductor layer 106 is disposed along the second side of the insulator layer 104. The resulting SOI structure includes two semiconductor layers 102 and 106 separated by the insulator layer 104. The lower semiconductor substrate 102 can be used as a handle during manufacturing and can be referred to as a handle substrate.

The electronic device 100 includes a multi-layer metallization structure 108 that extends over or above the upper second side of the semiconductor layer 106, as shown in FIG. 1. The SCR ESD protection device 101 in this example is fabricated on and/or in the upper semiconductor layer 106 in an active region 110 of the electronic device 100. The active region 110 in one example is laterally surrounded on four sides by an isolation region 112, although not a requirement of all possible implementations. The ESD protection device 101 also includes one or more isolation layers, including various shallow trench isolation (STI) structures with an isolation layer 114 formed in a corresponding trench in the upper second side of the semiconductor layer 106.

The ESD protection device 101 in FIGS. 1 and 2 is fabricated on and/or in the upper semiconductor layer 106 and includes a first implanted region 116 and a second implanted region 118 disposed in the semiconductor layer 106. The first implanted region 116 is disposed along a first portion of the upper second side of the semiconductor layer 106 and includes majority carrier dopants of a first type (e.g., P, such as boron). The second implanted region 118 is disposed along a second portion of the second side of the semiconductor layer 106 and is laterally spaced apart from the first implanted region 116 along a first direction (e.g., the "X" direction in FIGS. 1 and 2). The second implanted region 118 includes majority carrier dopants of a different second type (e.g., N, such as phosphorus). The ESD protection device 101 has a finger or "racetrack" shape, as shown in FIG. 2, where the second implanted region 118 is located at a center position, and the first implanted region 116 laterally surrounds the center position. Although a single finger shape is shown, different implementations can include more than one finger shape, formed generally parallel and spaced from one another along the first direction X.

The ESD protection device 101 in FIG. 1 also includes a third implanted region 120 disposed along a third portion of the upper second side of the semiconductor layer 106. The third implanted region 120 extends along the first direction X from the first implanted region 116 to the second implanted region 118. The third implanted region 120 includes majority carrier dopants of the second type N. In one example, the electronic device 100 is an integrated circuit with other electronic components fabricated on and/or in other regions of the SOI structure (not shown), including field effect transistors (FETs) with implanted source and drain regions. In this example, the FET source and drain features are concurrently formed with the corresponding ones of the respective first and second implanted regions 116 and 118 of the SCR ESD protection device 101. In this example, moreover, the FET devices may include lightly doped drain (LDD) implanted regions that are concurrently implanted with the third implanted region 120 of the SCR ESD protection device 101.

In one example, the LDD regions and the third implanted region 120 includes n-type majority carrier dopants (e.g., phosphorus) at a dopant concentration of $5\times10^{15}$ $cm^{-3}$ to $1\times10^{17}$ $cm^{-3}$ at or near the top of the region 120 beneath the STI isolation layer 114 to provide a drift region 122 between the respective first and second implanted regions 116 and 118. In one example, for a breakdown voltage rating of 100 V or more for the SCR ESD protection device 101, the n-type carrier concentration of the third implanted region 120 is about $2\times10^{16}$ $cm^{-3}$ at or near the top of the region 120 beneath the STI isolation layer 114. In certain implementations, increasing the dopant concentration can accommodate increased field plate/isolation layer overlap distances to facilitate reduced breakdown voltage variation for an ESD protection device 101. In one example, the third implanted region 120 has an implanted depth below the STI isolation layer 114 along a second direction (e.g., downward along the "Z" direction in FIG. 1) from 3 μm to 16 μm, such as 6-7 μm, for a 100 V breakdown voltage rating of the ESD protection device 101. The first and second directions X and Z are orthogonal to one another and are both orthogonal to a third direction "Y" shown in FIG. 2.

The SCR ESD protection device 101 in FIG. 1 includes a first isolation layer 114 that extends in a corresponding trench in the second side of the semiconductor layer 106 along the first direction X from a portion of the first implanted region 116 inward over the third implanted region 120 to a portion of the second implanted region 118.

The SCR ESD protection device 101 in this example forms an N-P-N-P structure to provide terminals of the SCR, including implanted portions 124 and 126 of the first implanted region 116 and implanted portions 128 and 129 of the second implanted region 118. The SCR cathode C includes a first implanted portion 126 of the first implanted region 116. The first implanted portion 126 of the first implanted region 116 includes majority carrier dopants of the second type N at a dopant concentration greater than a dopant concentration of a remainder of the first implanted region 116 (e.g., labeled "N+" in FIG. 1). The SCR gate G includes a second implanted portion 124 of the first implanted region 116. The second implanted portion 124 includes majority carrier dopants of the first type P at a dopant concentration greater than the dopant concentration of the remainder of the first implanted region 116 (e.g., labeled "P+").

The SCR anode A includes the implanted portion 128 of the second implanted region 118. The implanted portion 128 includes majority carrier dopants of the first type P at a dopant concentration greater than a dopant concentration of a remainder of the second implanted region 118 (e.g., labeled "P+"). The implanted portion 129 of the second implanted region 118 includes N type majority carrier dopants at a dopant concentration greater than a dopant concentration of the remainder of the second implanted region 118 (e.g., labeled "N+").

The ESD protection device 101 also includes a conductive field plate 130 disposed over part of the second side of the semiconductor layer 106. In one example, the conductive field plate 130 is or includes polysilicon, which can be doped with impurities in one implementation. The conductive field plate 130 extends along the first direction X over a portion of the first implanted region 116 from the first implanted portion 126 thereof, past the first implanted region 116 and over a portion of the isolation layer 114. The conductive field plate 130 extends over a portion of the isolation layer 114 by a non-zero overlap distance 131. The first isolation layer 114 has a thickness 132 along the second direction Z, such as about 0.6 μm in one example. The overlap distance 131 is 3.5 to 5.0 times the isolation layer thickness 132. The ESD protection device 101 in FIGS. 1 and 2 also includes a second isolation layer 114 that extends in a corresponding second trench in the second side of the semiconductor layer 106 in the first implanted region 116. The second isolation layer 114 is laterally spaced apart from the first isolation layer 114 and has a length 133 along the first direction X in FIG. 1 of 4 μm to 8 μm. For example, the second isolation layer 114 may extend in the X-Y plane (e.g., around the finger shape in FIG. 2) from implanted portion 124 to implanted portion 126 with a length 133 of 4 μm to 8 μm.

In one example, the overlap distance 131 is 2.2 to 3.0 μm, the isolation layer thickness 132 is 0.6 μm, the n-type majority carrier concentration of the third implanted region 120 is about $2 \times 10^{16}$ cm$^{-3}$ at or near the top of the region 120 beneath the STI isolation layer 114, and the implanted depth of the third implanted region 120 below the STI isolation layer 114 along the second direction Z is in a range from 3 μm to 16 μm, such as 6-7 μm, for a 100 V breakdown voltage rating of the ESD protection device 101. As discussed below in connection with FIGS. 20-24, the relative sizes of the overlap distance 131, the isolation layer thickness 132, and the dopant concentration of the third implanted region 120 are tailored in ratiometric fashion to control (e.g., mitigate) breakdown voltage variation with handle substrate biasing in operation of the ESD protection device 101, wherein controlling the ratio of the overlap distance 131 to the isolation layer thickness 132 in a range of 3.5 to 5.0 provides benefits in terms of breakdown voltage stability for the electronic device 100. In another example, for an isolation layer thickness 132 of 0.6 μm and a nominal breakdown voltage of around 100 V (e.g., +/−2 V), the overlap distance 131 is in a range of 2.2 μm to 3.0 μm (e.g., the ratio of the overlap distance 131 to the isolation layer thickness 132 is in a range of 3.67 to 5.00).

The multi-layer metallization structure 108 in the electronic device 100 includes conductive structures that electrically connect the cathode C and the gate G of the SCR 101 to one another. This provides an ESD protection device 101 that can be triggered by an ESD event that causes a voltage of a protected node of the device 100 to exceed a given designed breakdown voltage level. In one example described below in connection with FIG. 30, the ESD protection device 101 is connected to a protected pad (e.g., externally accessible pin, lead, etc.) of an IC electronic device to protect an internal circuit from ESD events associated with the protected pad. The example metallization structure 108 in FIG. 1 includes a first level 140 with a pre-metal dielectric (PMD) material layer 141 (e.g., SiO$_2$), with conductive (e.g., tungsten, aluminum, copper, etc.) contacts 142 at select locations to provide electrical connection to the implanted portions 124, 126, 128 and 129 for selective interconnection of the terminals of the ESD protection device 101. The metallization structure 108 includes a second level 150, with an inter-level or inter-layer dielectric (ILD) material layer 151 (e.g., SiO$_2$) and conductive features 152 (e.g., copper, aluminum, etc.), as well as a third level 160 with an associated ILD layer 161 and conductive features 162, and a final level 170 with an ILD layer 171 and conductive features 172.

The sectional top view of FIG. 2 illustrates an example of the racetrack or finger shape, for a single finger example of the SCR ESD protection device 101. In the illustrated example, the finger shape includes a first (e.g., upper) end and an opposite second (e.g., lower) spaced from one another along the third direction Y. The finger shape includes a straight portion 200 that extends along the third direction Y, as well as a first (e.g., upper) turn portion 201 at the first end of the finger shape, and a second (e.g., lower) turn portion 202 at the second end of the finger shape. In this example, the first implanted region 116 and the second implanted region 118 extend in the straight portion 200, as well as around the first and second turn portions 201 and 202, respectively. Extending the first and second implanted regions 116 and 118 around the turn portions 201 and 202 provides improved ESD current carrying capability for the SCR ESD protection device 101 and mitigates ESD current carrying capability variations even in the presence of handle substrate biasing during operation of the electronic device 100. Similar racetrack or finger-shaped structure enhancements can be used in other implementations, such as the PNP bipolar transistor ESD protection device example in FIGS. 16 and 17 below, as well as in the NPN bipolar transistor ESD protection device example in FIGS. 18 and 19 below.

In the example electronic device 100 of FIGS. 1 and 2, the SCR ESD protection device 101 is fabricated on and/or in the upper SOI semiconductor layer 106, which affects the voltage potential distribution inside the ESD protection device 101 and its breakdown voltage. The conductive field plate 130 can counteract the bottom substrate biasing effect and reduce/eliminate handle substrate effects on the breakdown voltage of the ESD protection device 101. In addition, the example SCR ESD protection device 101 includes the second isolation layer (e.g., STI) between the gate and cathode implanted portions 124 and 126 in the first implanted region 116, which helps control latch-up by increasing the gate resistance and improve the breakdown voltage stability and enhance the ESD current carrying capability with respect to handle substrate biasing effects.

Referring now to FIGS. 3-15, FIG. 3 shows a method 300 for fabricating an electronic device, such as an IC with an ESD protection device. FIGS. 4-15 show the electronic device 100 of FIGS. 1 and 2 and the SCR ESD protection device 101 at different stages of fabrication according to the method 300 of FIG. 3. In other examples, the method 300 can be implemented to fabricate ICs or other electronic devices with PNP, NPN or other types of ESD protection devices, such as those in FIGS. 16-19 below. The method 300 shows acts and events associated with construction of the example SCR ESD protection device 101, and these steps may concurrently be used for fabricating other electronic circuits and/or components (e.g., transistor circuits, etc.) in a single IC with the ESD protection device 101, and a metallization structure (e.g., the metallization structure 108 in FIG. 1) can be constructed according to the method 300 to connect one or more terminals of the ESD protection device 101 to a protected circuit of the IC (not shown).

Figure 3:
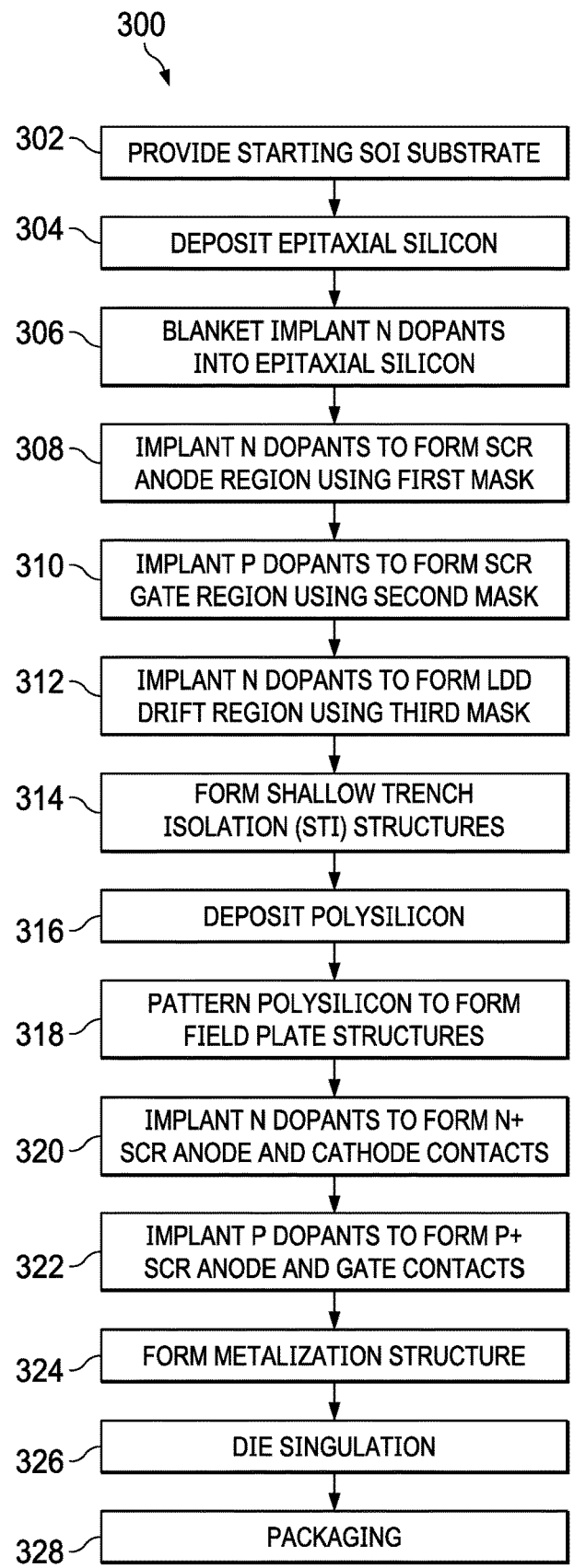
FIG. 3 is a flow diagram of a method for making an ESD protection device in an integrated circuit.
Figure 4:
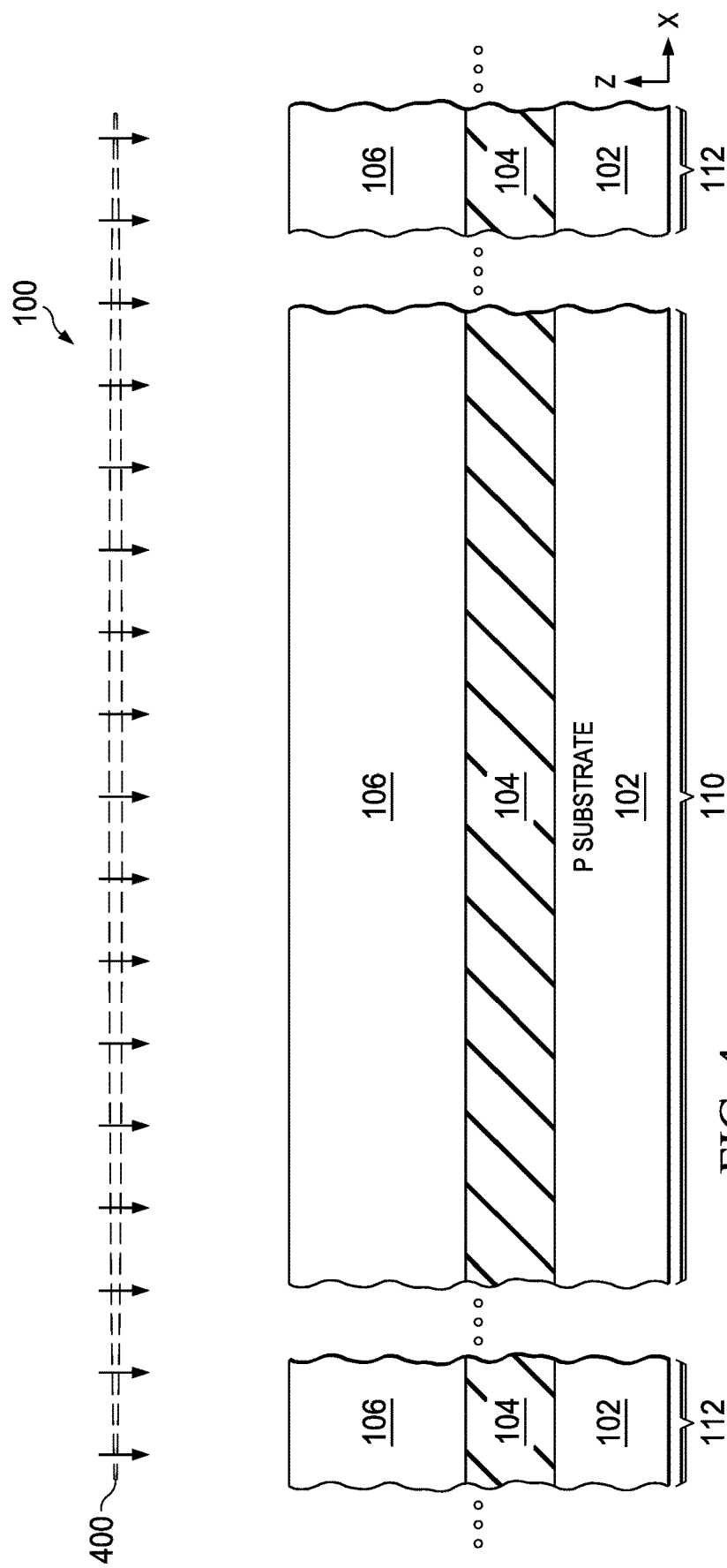
FIGS. 4-15 are partial sectional side elevation views of the electronic device of FIG. 1 at different stages of fabrication according to the method of FIG. 3.
Figure 5:
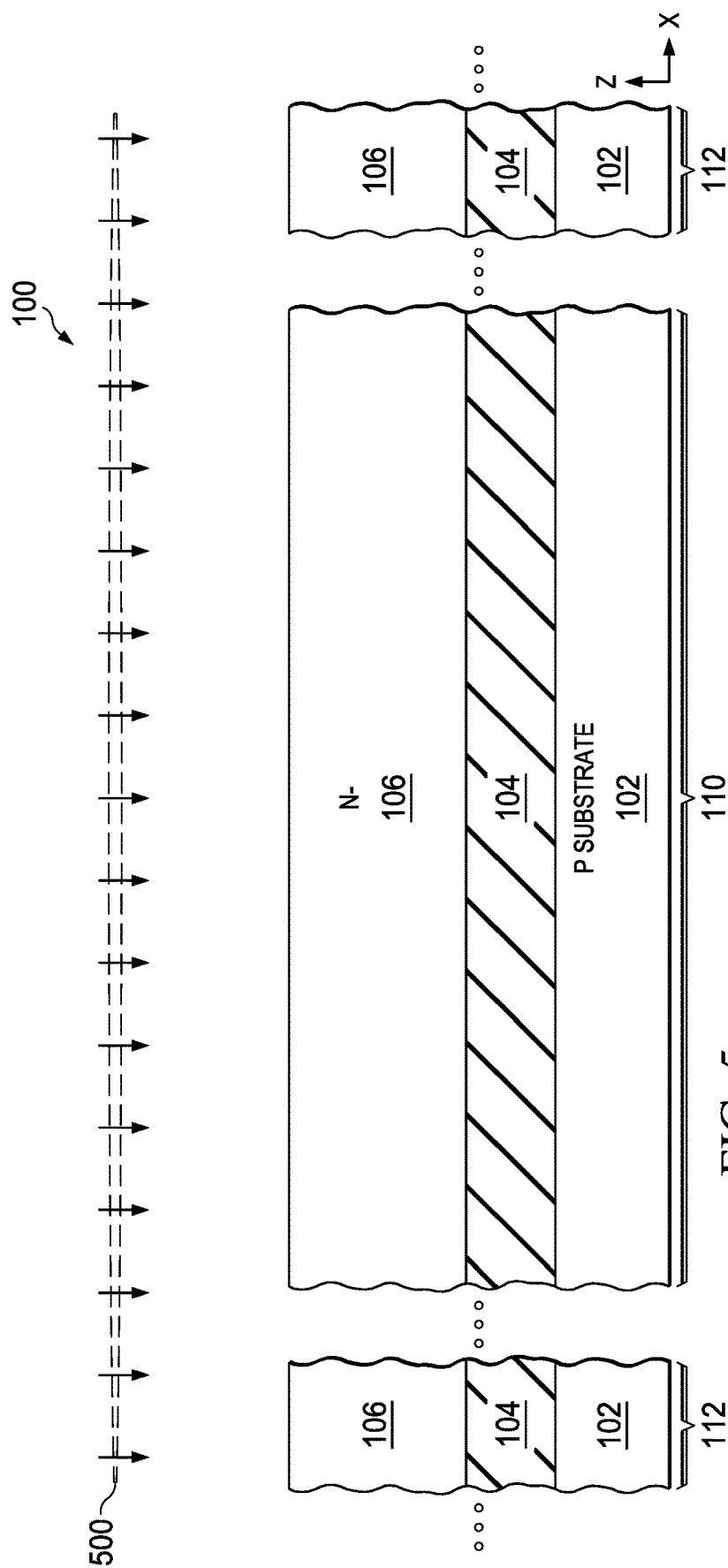

The method 300 includes providing a starting SOI substrate at 302 in FIG. 3. In one example, a p-doped silicon handle substrate 102 and an insulator (e.g., SiO$_2$) layer 104 is provided at 302. FIG. 4 shows an example starting SOI substrate 102, 104 including a prospective active region 110 and a surrounding isolation region 112. Similar processing is shown for the active region 110 and the isolation region 112 in FIGS. 4-15. In other examples, different processing is used to form an isolation barrier in the region 112 that surrounds the active region 110, for example, forming deep trench isolation structures and/or different doping in the isolation region 112 to electrically isolate circuitry of the active region 110, or portions thereof, from other circuits outside the active region 110.

The example handle substrate 102 is or includes silicon with p-type dopants (e.g., boron), but other semiconductor materials or combinations thereof can be used in other implementations. At 304, one or more epitaxial layers are formed (e.g., deposited) on the upper second side of the insulator layer 104. FIG. 4 shows one example, in which an epitaxial growth deposition process 400 is performed, which deposits the epitaxial silicon layer 106 on the upper second side of the insulator layer 104. The process 400 in one example forms n-doped epitaxial silicon layer 106. In other example, a separate blanket implantation process 500 (FIG. 5) is performed at 306 in FIG. 3 to implant n-type dopants (e.g., phosphorus) into the epitaxial silicon layer 106. Various implantation steps and processes are used in the example method 300, some or all of which may include subsequent thermal processing, such as annealing to activate and diffuse implanted dopants. In addition, the plantation processes can be concurrently used for implanting features of other circuitry (not shown), such as source and drain regions for field effect transistors, including LDD implants to fabricate transistors or other circuitry outside the illustrated active region 110.

Figure 6:
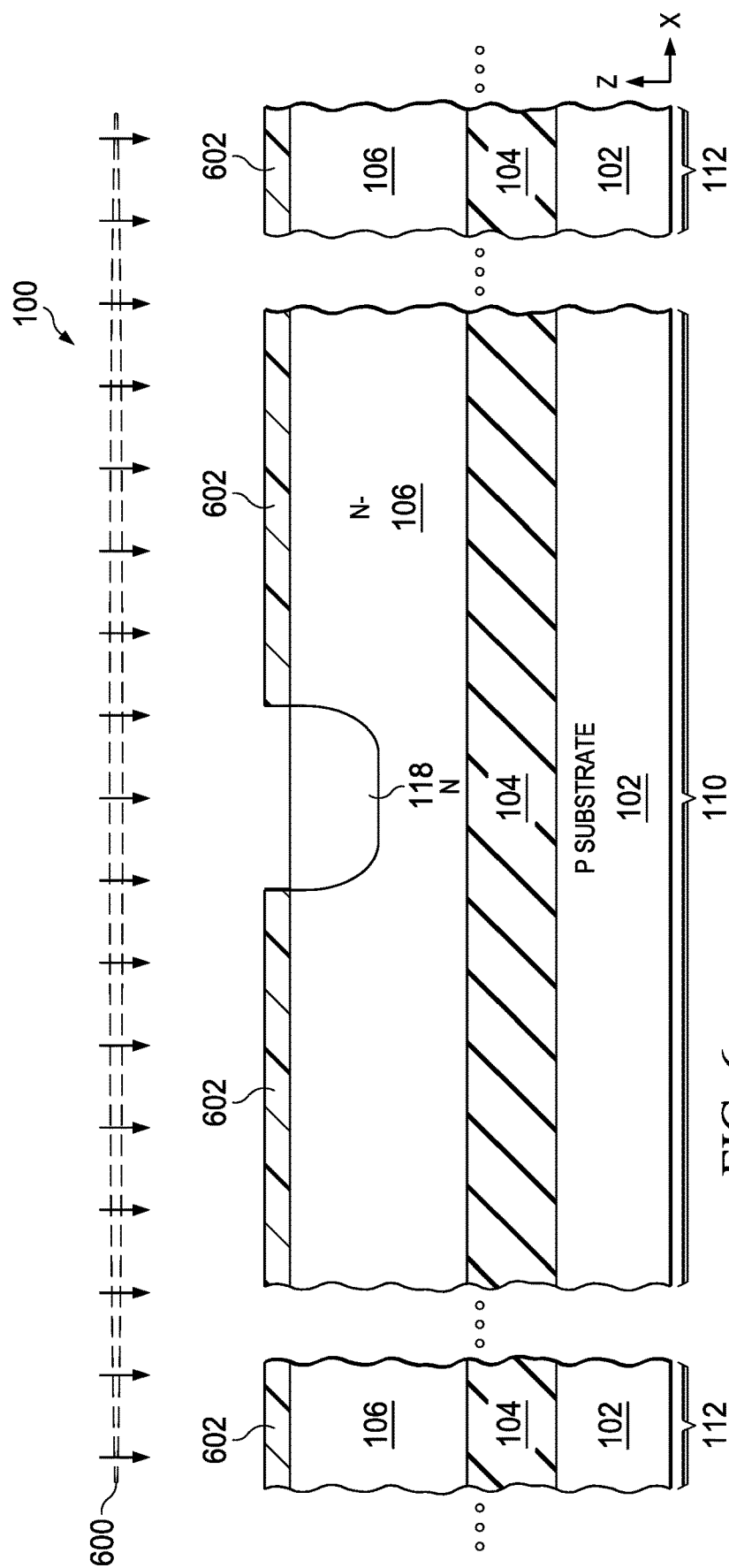
Figure 7:
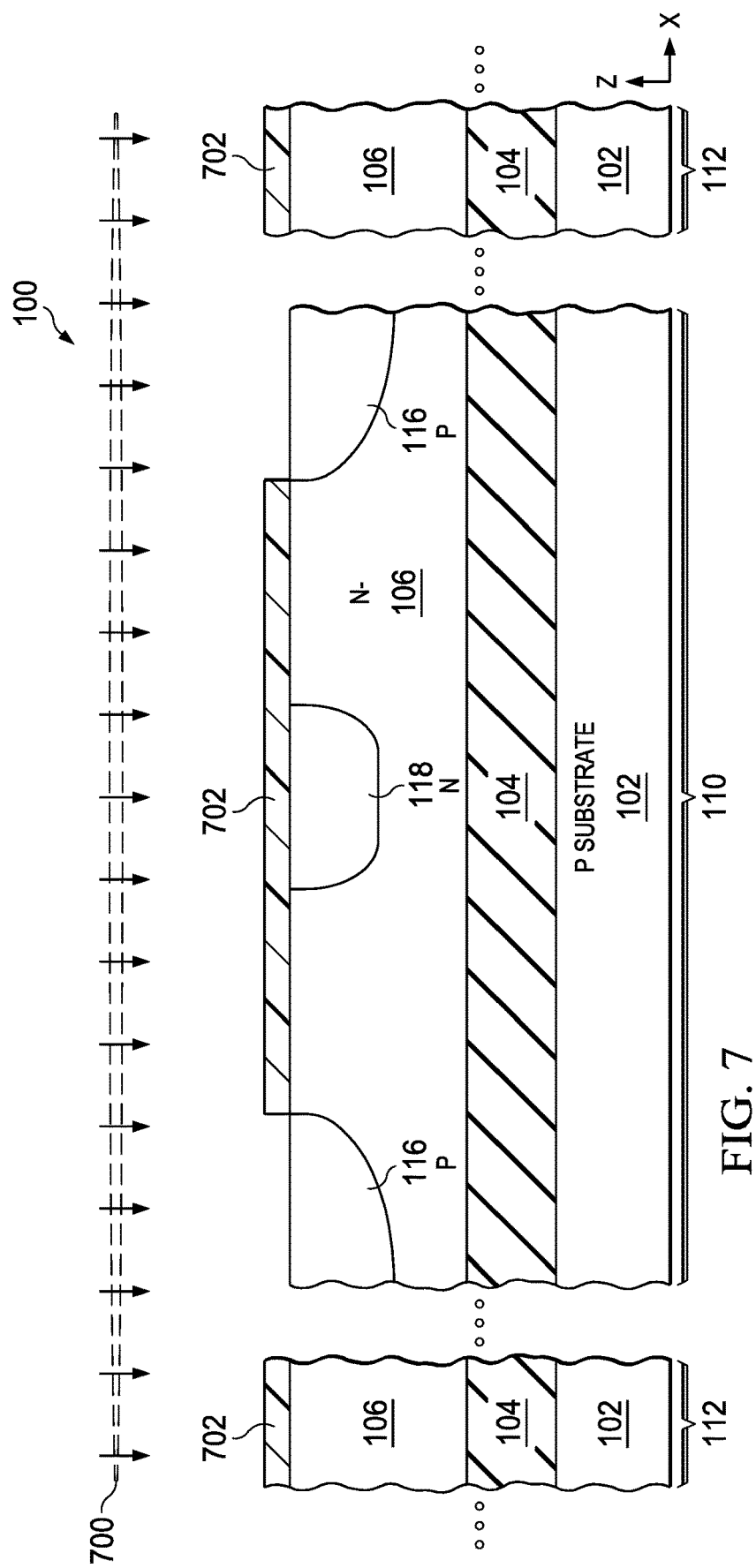

The method 300 continues at 308 with implanting n-type dopants to form SCR anode regions using a first mask. FIG. 6 shows one example, in which an implantation process 600 is performed using a first implant mask 602. The process 600 in one example implants phosphorus or other n-type dopants into an exposed portion of the upper second side of the semiconductor layer 106 to form the second implanted region 118 disposed along a portion of the upper second side of the semiconductor layer 106. At 310 in FIG. 3, the method 300 continues with implanting p-dopants to form an SCR gate region using a second mask. FIG. 7 shows one example, in which an implantation process 700 is performed using an implantation mask 702. The implantation process 700 implants boron or other p-type dopants into an exposed portion of the upper second side of the semiconductor layer 106 to form the first implanted region 116.

Figure 8:
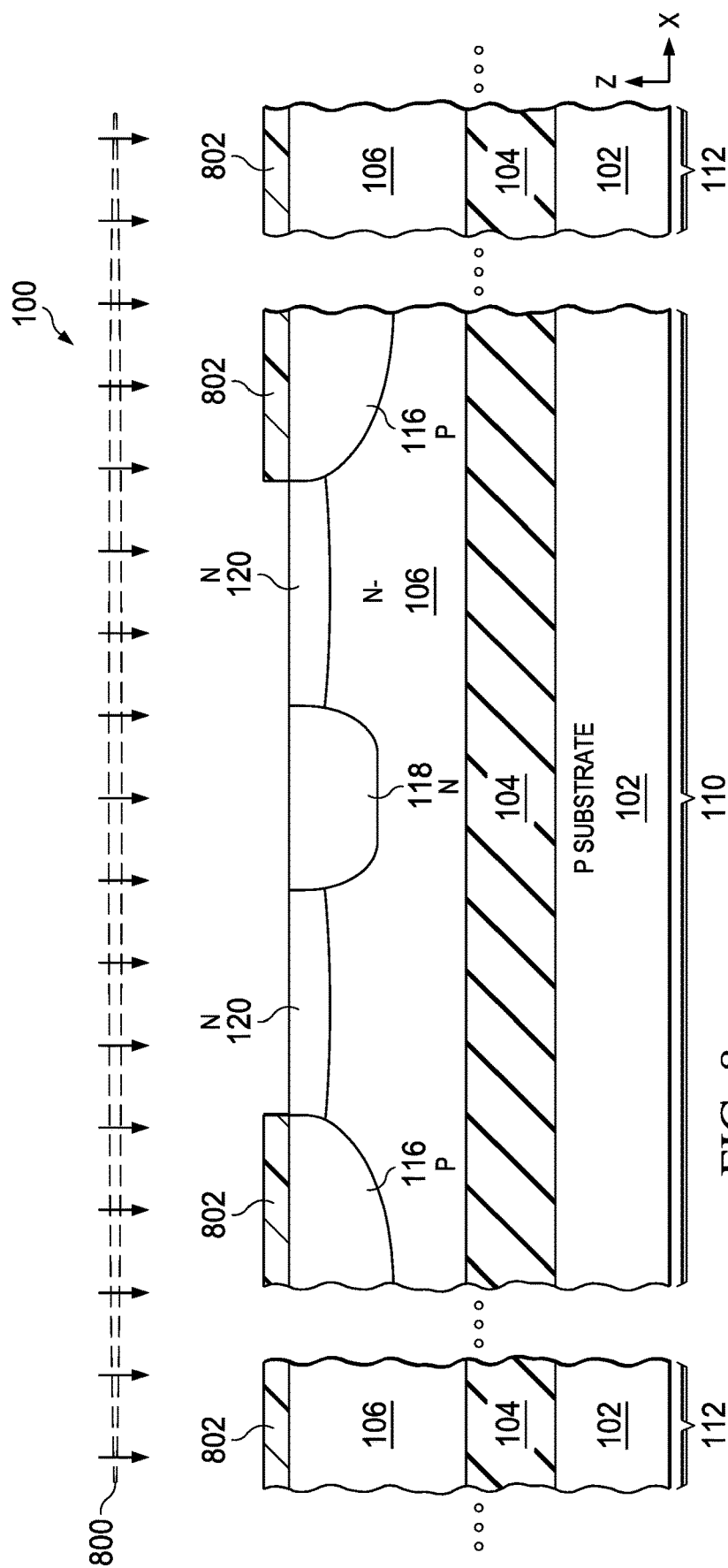

The method 300 continues at 312 with implanting n-type dopants to form the third implanted region 120, for example, using a lightly doped drain (LDD) implantation and mask that are concurrently used elsewhere in the electronic device 100 to form other circuits (not shown). FIG. 8 shows one example, in which a third implantation process 800 is performed using a third implant mask 802, which implants phosphorus or other n-type dopants into the exposed region between the portions of the first implanted region 116. In this example, the implant mask 802 exposes the previously n-doped second implanted region 118, although the mask 802 in other examples covers the second implanted region 118. In another possible implementation, the LDD implant is performed after forming polysilicon structures (e.g., 316 and 318 described below).

In one example, the implantation process 800, and any subsequent thermal annealing process are tailored to control the final dopant concentration of the third implanted region 120 to be tailored according to the overlap distance 131 (e.g., FIG. 1) of the subsequently formed conductive field plate over a portion of the isolation layer 114, and to the first isolation layer thickness 132. In one example, the implantation process 800 in FIG. 8 forms the third implanted region 120 with n-type majority carrier dopants (e.g., phosphorus) at a dopant concentration of $5 \times 10^{15}$ cm$^{-3}$ to $1 \times 10^{17}$ cm$^{-3}$, such as about $2 \times 10^{16}$ cm$^{-3}$, at or near the top of the region 120 beneath the subsequently formed STI isolation layer 114 (e.g., FIG. 1 above) to provide a drift region 122 between the respective first and second implanted regions 116 and 118. In one example, the implantation process 800 and any subsequent annealing create the third implanted region 120 with an implanted depth from 3 μm to 16 μm, such as 6-7 μm, below the bottom of the subsequently formed STI isolation layer.

Figure 9:
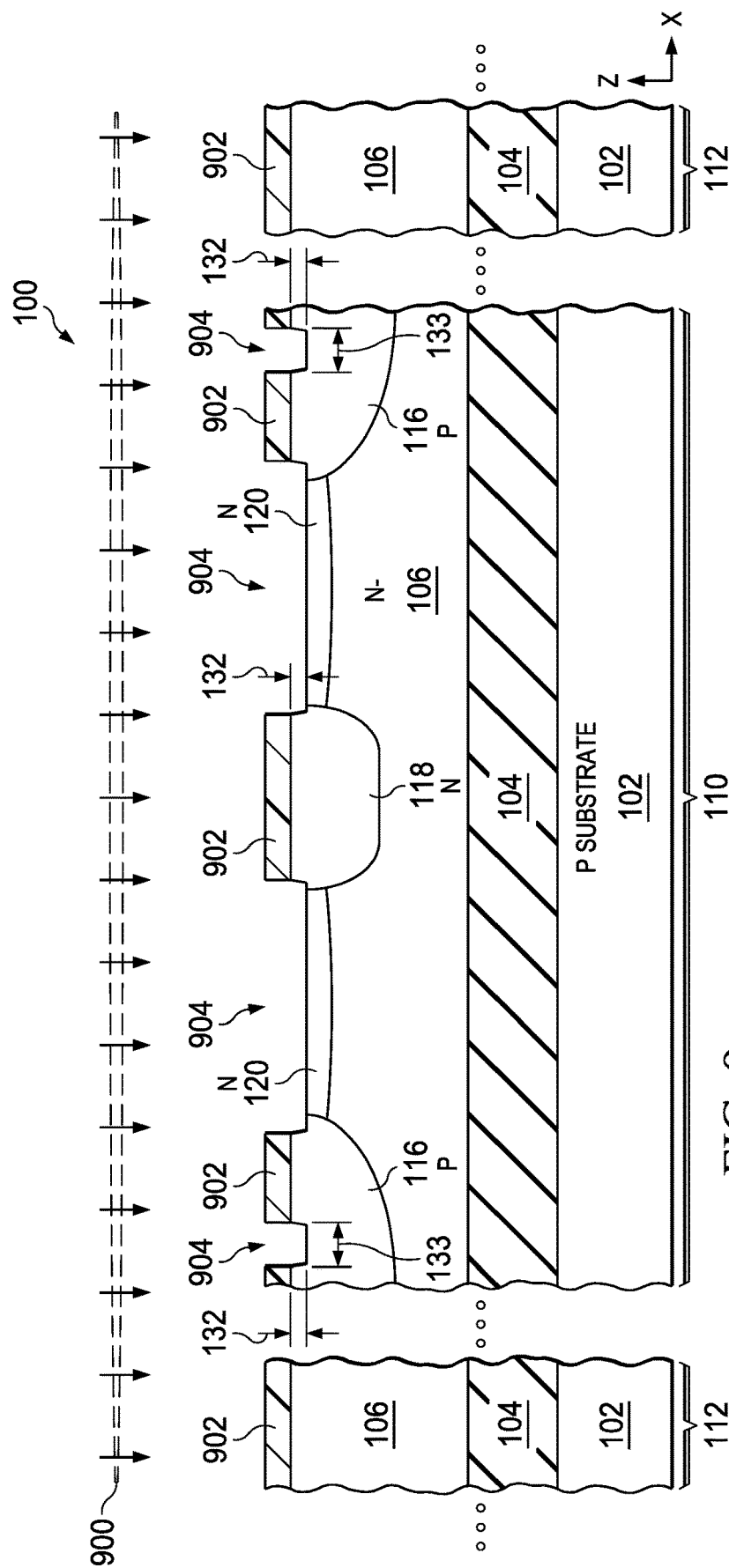
Figure 10:
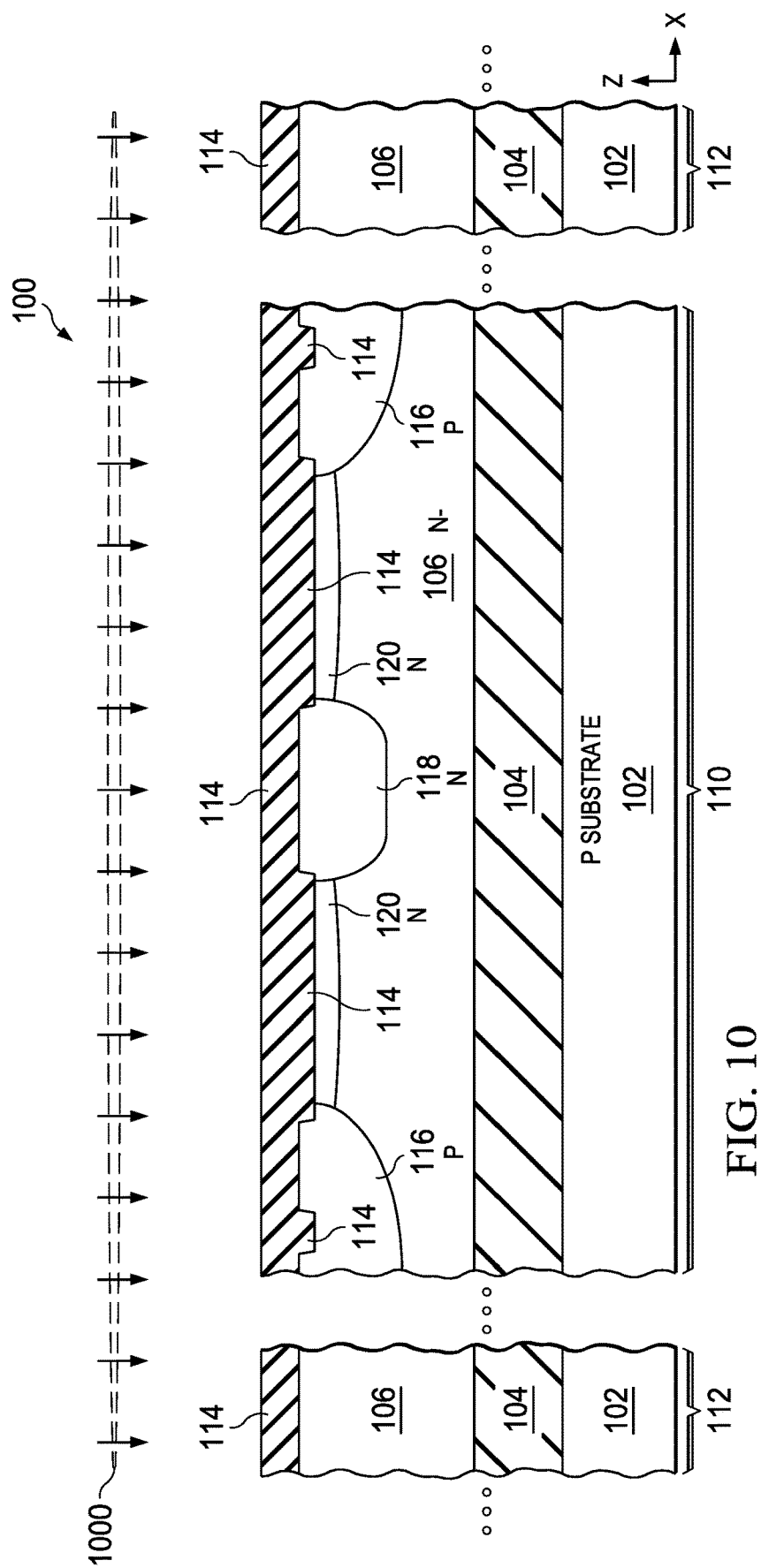
Figure 11:
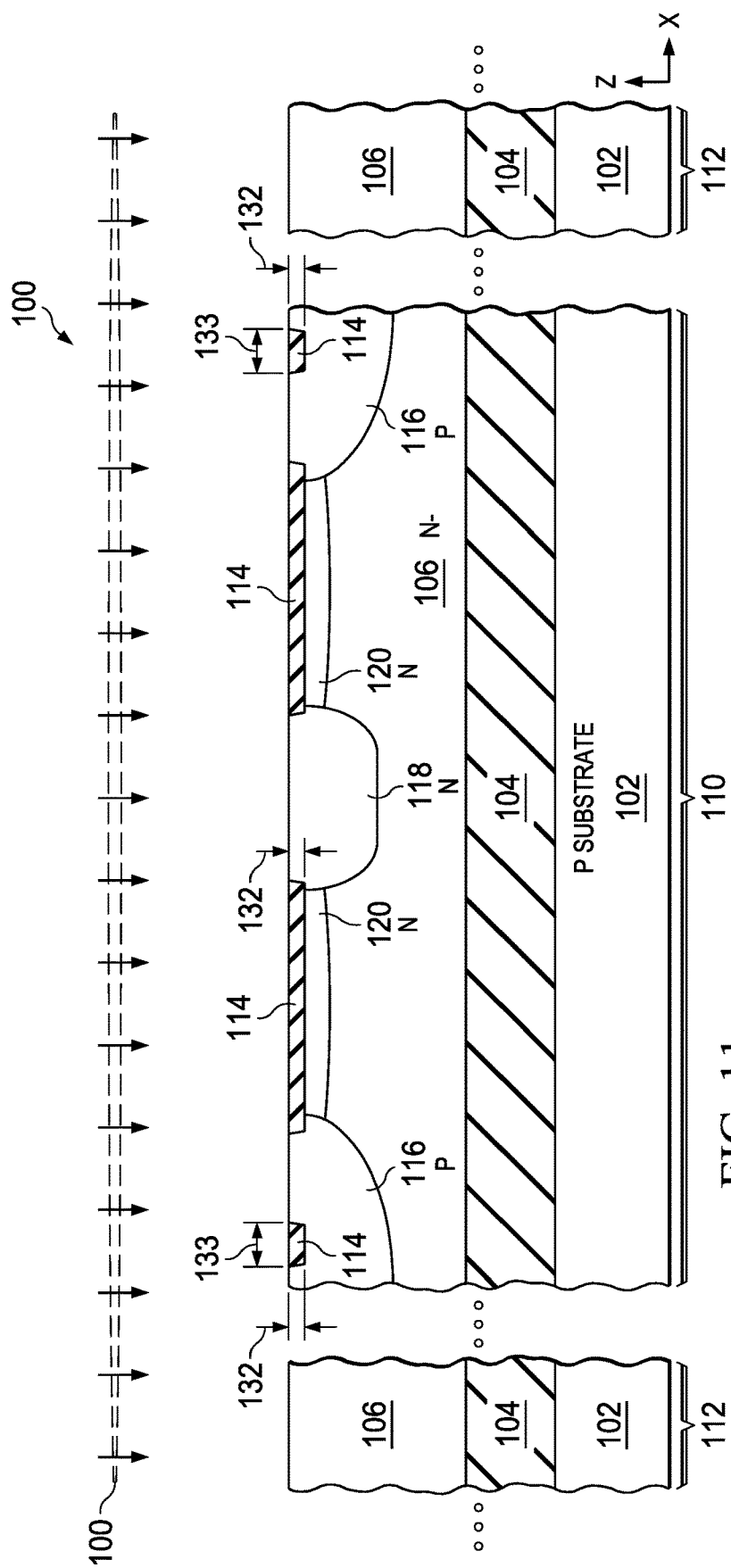
Figure 12:
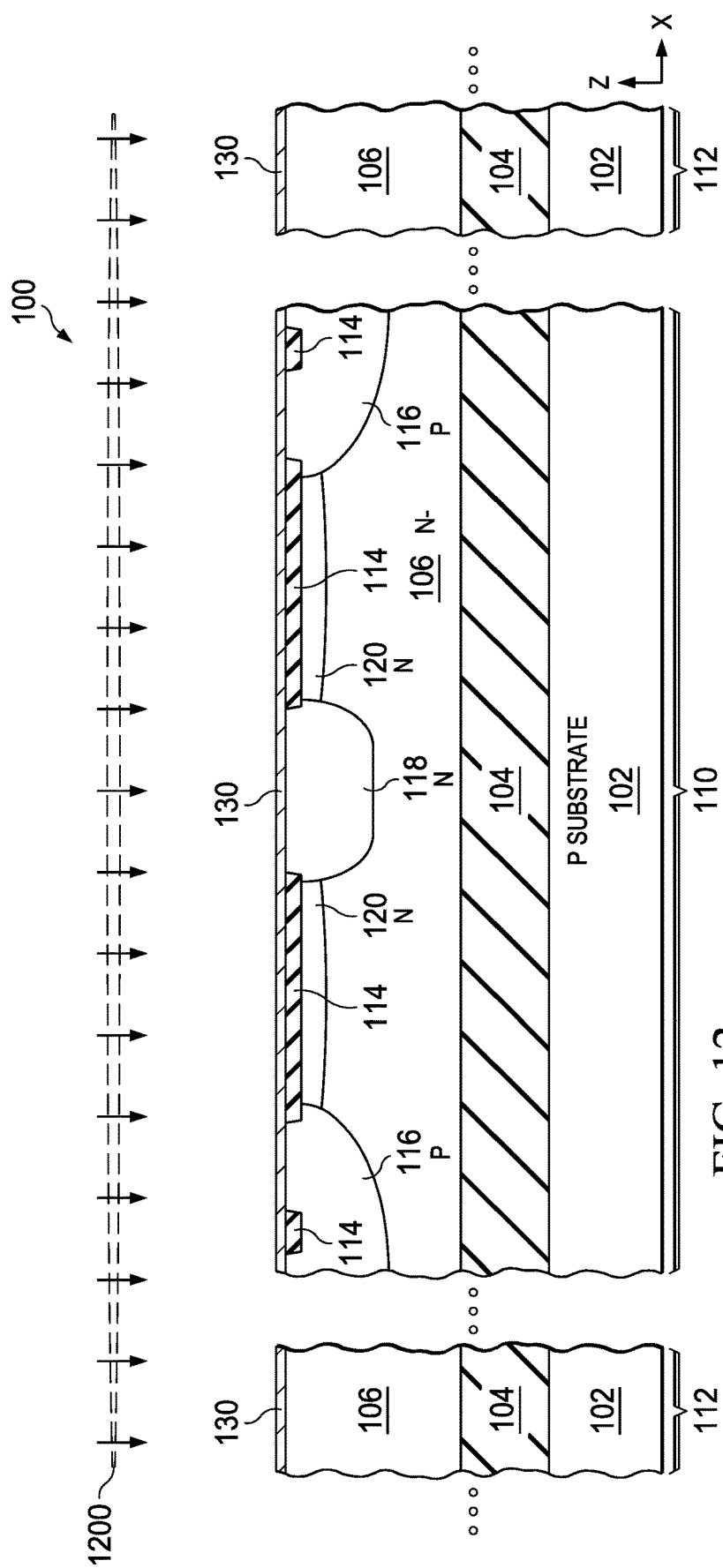

The method 300 continues at 314 in FIG. 3 with a shallow trench isolation processing to form shallow trench isolation layers (e.g., 114 in FIG. 1). Other processes can be used, such as local oxidation of silicon (LOCOS) processing at 220 to form SiO$_2$ isolation layers 114. FIGS. 9-11 show one example of STI processing at 314. FIG. 9 shows an example of STI trench formation, including performing an etch process 900 with an etch mask 902. The etch process 900 in one example etches through exposed portions of the upper second side of the semiconductor layer 106 to form trenches 904 having a depth 132 tailored according to a design overlap distance 131 (e.g., FIG. 1) of the subsequently formed conductive field plate over a portion of the isolation layer 114 in order to achieve a ratio of the overlap distance 131 to the isolation layer thickness 132 in a range of 3.502 5.0, such as 3.67 to 5.00. In the illustrated example, the etch process 900 is continued for a controlled time in order to provide a trench depth 132 of approximately 0.6 μm.

The trench etch mask 902 is then removed, and a blanket oxide deposition process 1000 is performed in FIG. 10 to deposit SiO$_2$ or other suitable isolation material 114 in the etched trenches. FIG. 11 illustrates a subsequent planarization process 1100, such as chemical mechanical polishing (CMP) that removes excess portions of the deposited isolation material 114, to leave the finished STI isolation structures 114. As further shown in FIG. 11, the SCR implementation of FIGS. 1, 2 and 4-15 provides the second isolation layer having a lateral width 133 along the first direction X, where the trench etch mask 902 in FIG. 9 includes openings tailored to achieve the isolation layer width 133 for the isolation layer 114 within the first implanted region 116. The isolation layers 114 may, but need not, have an upper surface that is generally coplanar with the upper second surface of the semiconductor layer 106.

Figure 13:
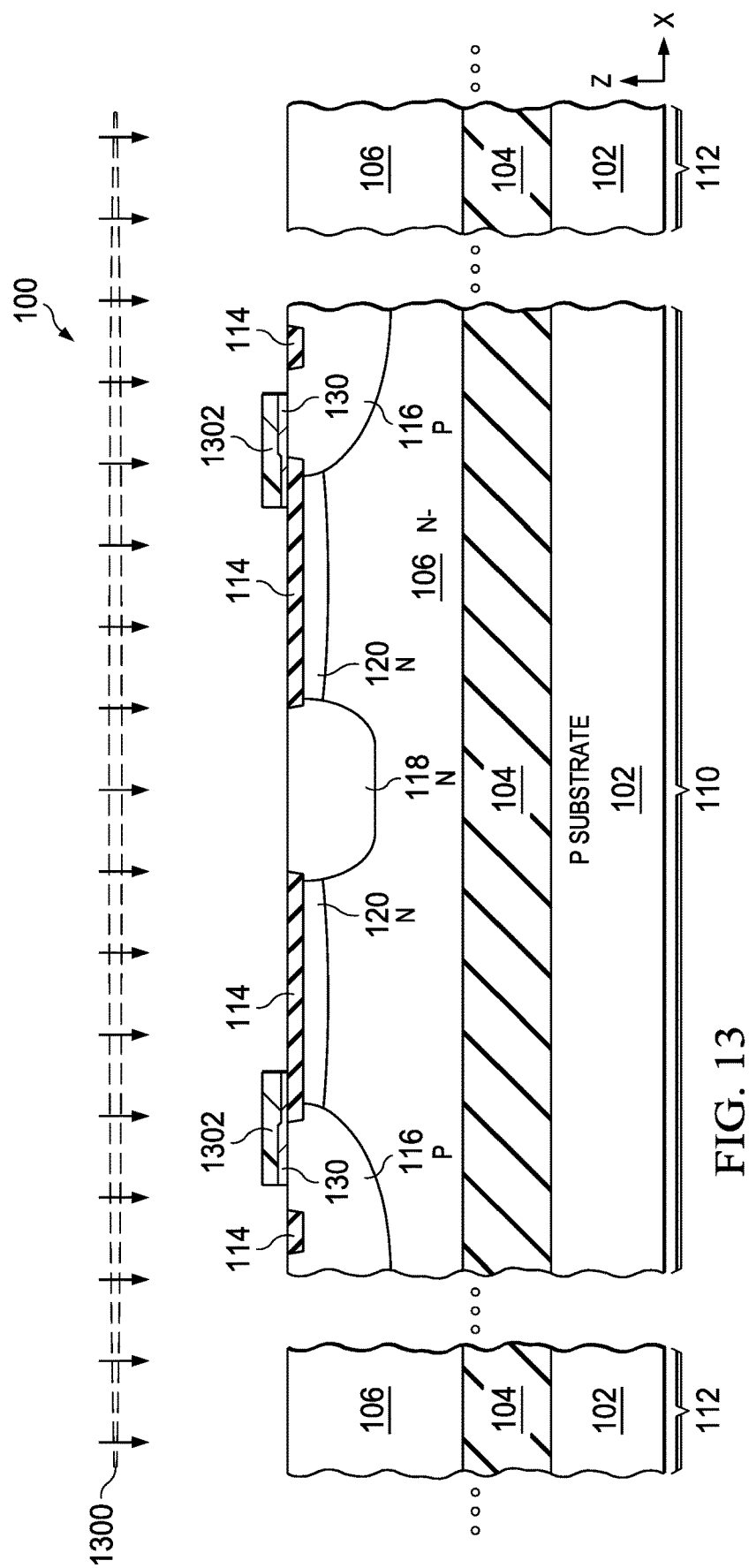

The method 300 continues at 316 and 318 in FIG. 3 with polysilicon processing to form a field plate structures (e.g., the conductive field plate 130 in FIG. 1 above). At 316, polysilicon is deposited, for example, using a blanket polysilicon deposition process 1200 and FIG. 12 that deposits polysilicon material 130 over the STI isolation layers 114 and the remaining exposed upper second side of the semiconductor layer 106. The polysilicon formation processing in FIG. 12 can include doping the deposited polysilicon to control the conductivity thereof. The deposited polysilicon is patterned at 318 in FIG. 3 to form the field plate structure. FIG. 13 shows one example, in which an etch process 1300 is performed using an etch mask 1302 to remove deposited polysilicon from the exposed portions of the isolation layers 114 and the remaining exposed upper second side of the semiconductor layer 106. The etch mask 1302 is then removed, to leave the patterned conductive polysilicon field plate 130.

Figure 14:
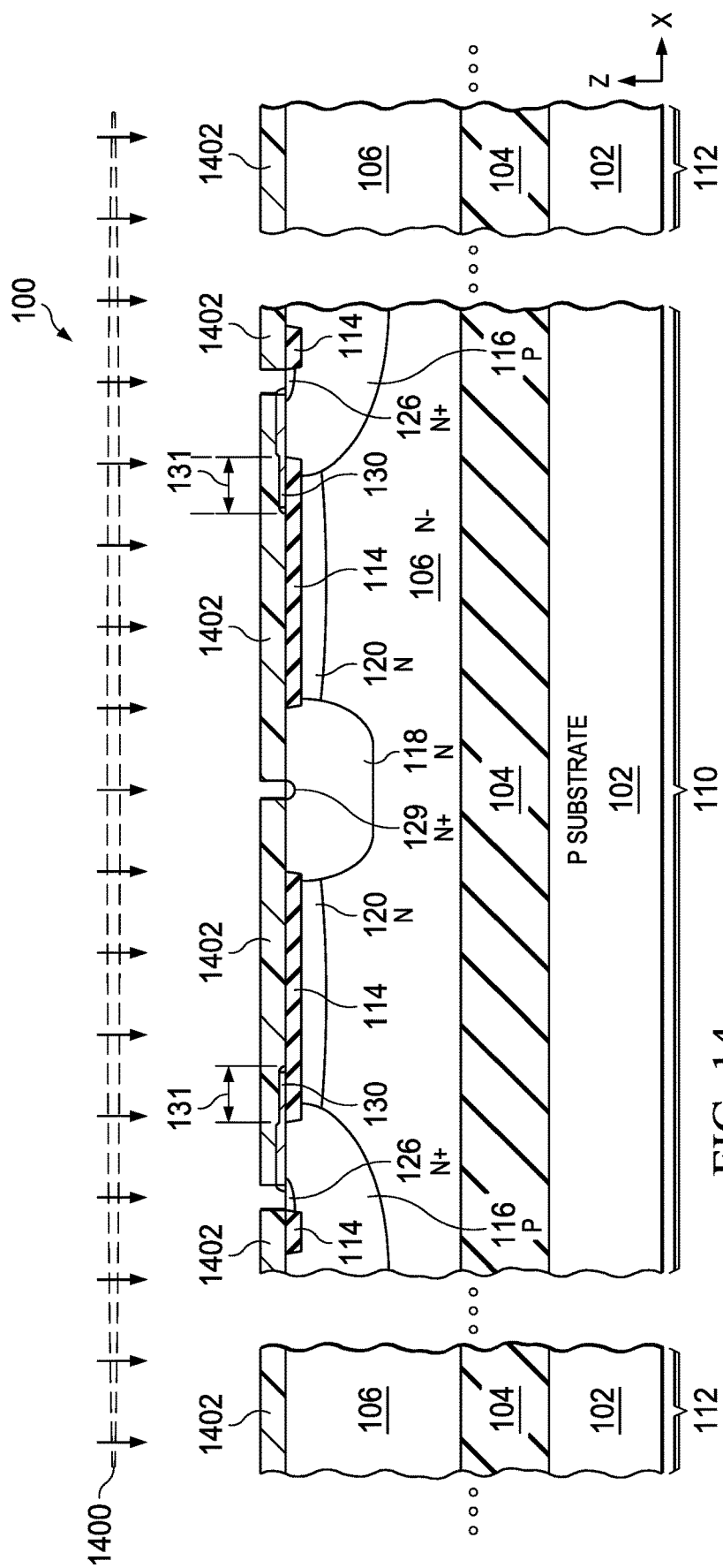

The method 300 continues at 320 in FIG. 3 with implanting n-type dopants to form heavily doped SCR anode and cathode contact implanted portions. FIG. 14 shows one example, in which an implantation process 1400 is performed with an implantation mask 1402. The implantation process 1400 implants phosphorus or other n-type dopants to form the implanted portion 126 of the first implanted region 116 and the implanted portion 129 of the second implanted region 118 (e.g., labeled N+ in FIG. 14). The process 1400 implants the n-type dopants to form the implanted portions 126 and 129 having higher dopant concentrations and the associated first and second implanted regions 116 and 118, respectively.

Figure 15:
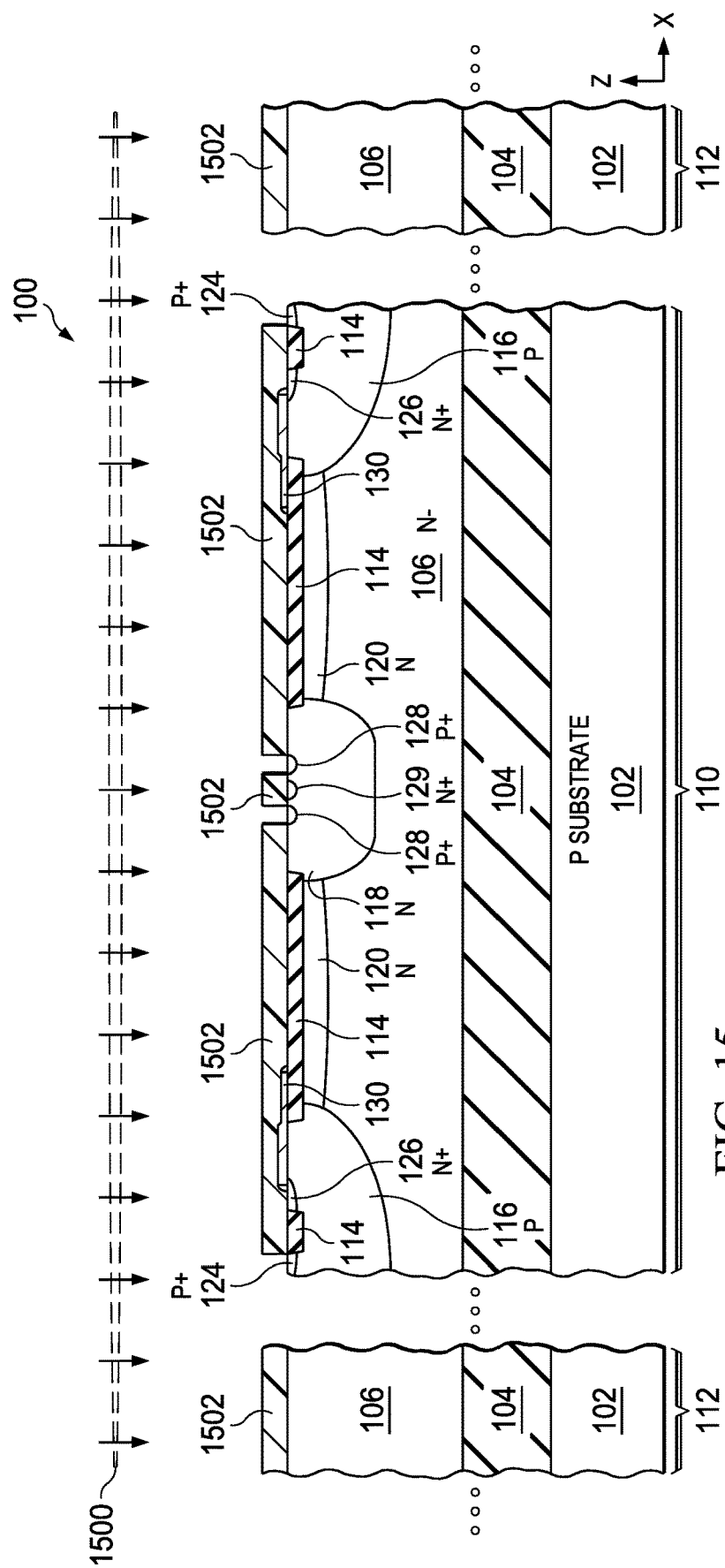

At 322 in FIG. 3, the method 300 continues with implanting p-dopants to form the P+ SCR anode and gate contacts. FIG. 15 shows one example, in which an implantation process 1500 is performed with an implantation mask 1502. The implantation process 1500 in this example implants boron or other p-type dopants to form the implanted portion 124 of the first implanted region 116 and the implanted portion 128 of the second implanted region 118 (labeled P+ in FIG. 15). The method 300 also includes back end processing, such as metallization processing at 324 to form contacts and metallization structures (e.g., the multi-level metallization structure 108 in FIG. 1 above). The method 300 also includes die singulation or separation at 326 in FIG. 3, and packaging at 328 in order to provide a packaged electronic device, such as an IC.

Figure 16:
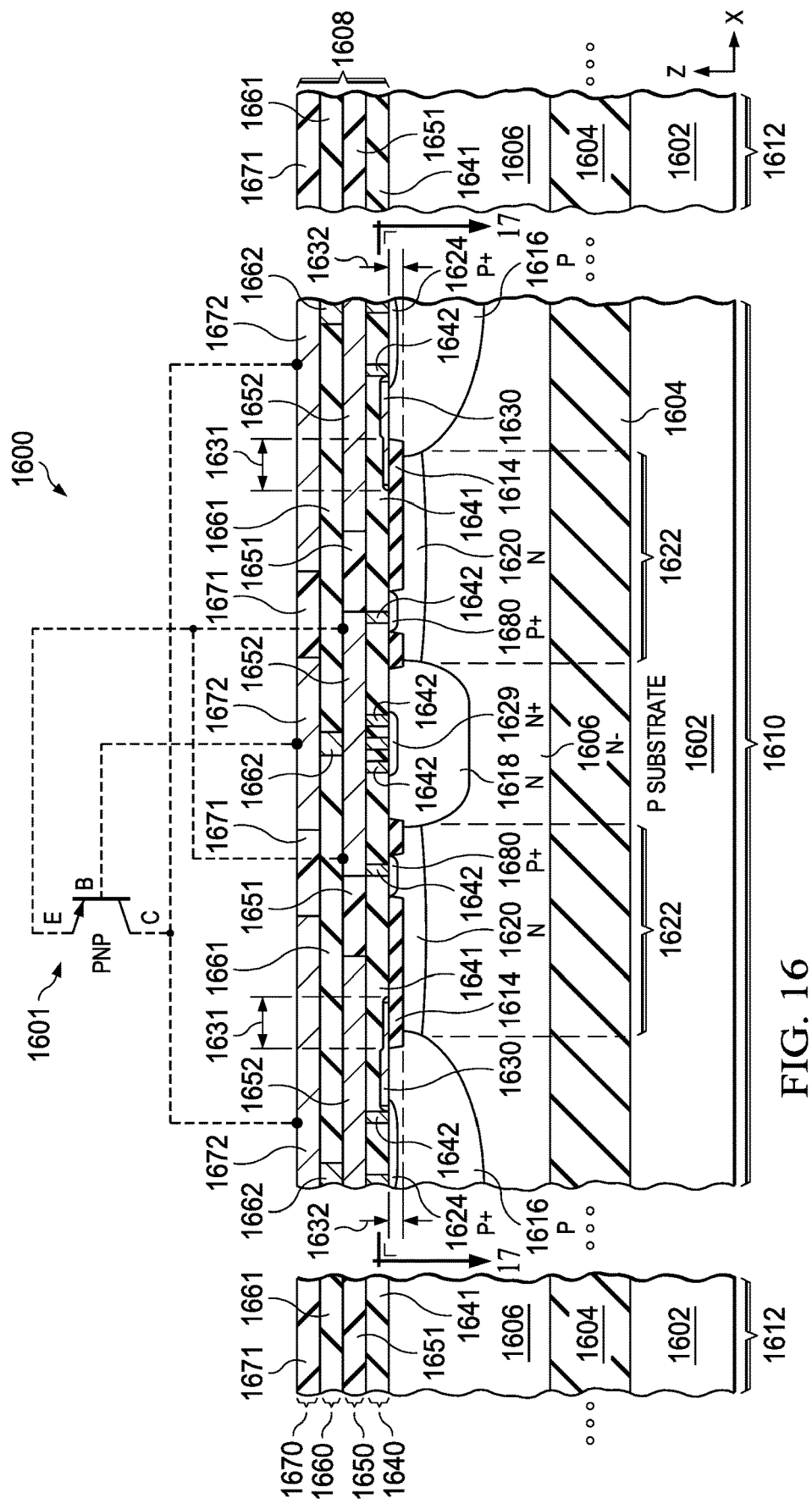
FIG. 16 is a partial sectional side elevation view of another IC with a PNP bipolar transistor ESD protection device.
Figure 17:
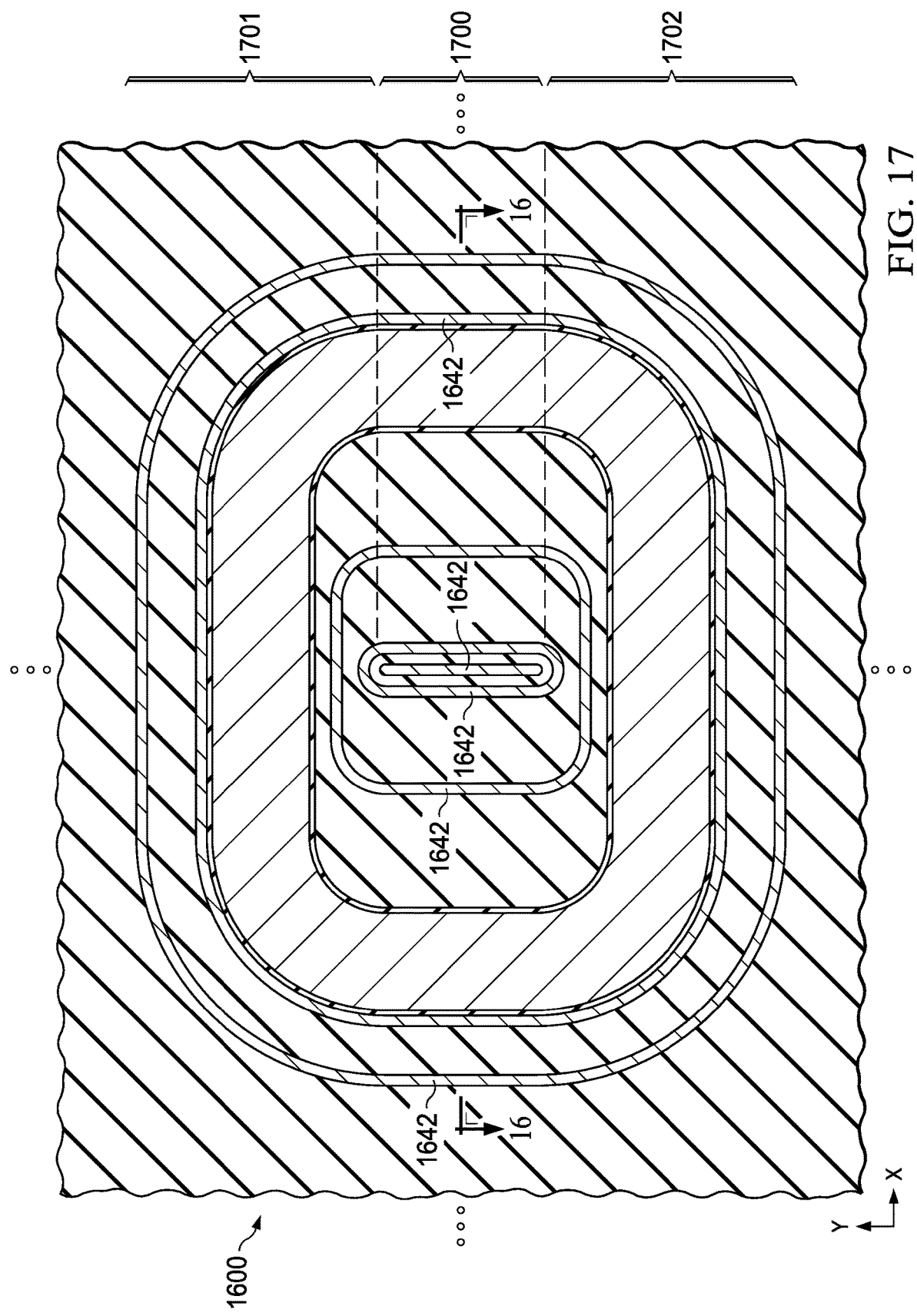
FIG. 17 is a partial sectional top plan view of the PNP ESD protection device taken along line 17-17 in FIG. 16.

FIGS. 16 and 17 show another example electronic device 1600 that includes a PNP bipolar transistor-type ESD protection device 1601. The electronic device 1600 in FIGS. 16 and 17 includes structures, nodes, features, regions, dimensions, and materials 1602, 1604, 1606, 1608, 1610, 1612, 1614, 1616, 1618, 1620, 1622, 1624, 1629, 1630, 1631, 1632, 1640, 1641, 1642, 1650, 1651, 1652, 1660, 1661, 1662, 1670, 1671, and 1672, that generally correspond to the respective structures, nodes, features, regions, dimensions, and materials 102, 104, 106, 108, 110, 112, 114, 11, 118, 120, 122, 124, 129, 130, 131, 132, 140, 141, 142, 150, 151, 152, 160, 161, 162, 170, 171, and 172 of the electronic device 100 as described in connection with FIGS. 1 and 2 above. FIG. 16 shows a partial sectional side elevation view the electronic device 1600 taken along line 16-16 in FIG. 17, and FIG. 17 shows a partial sectional top plan view of the electronic device 1600 taken along line 17-17 in FIG. 16, including the PMD layer contacts 1642.

In this example, the ESD protection device 1601 is a PNP transistor 1601 with a collector C that includes the implanted portion 1624 of the first implanted region 1616. The implanted portion 1626 of the first implanted region 1616 includes p-type majority carrier dopants (e.g., boron, etc) at a dopant concentration greater than the dopant concentration of the remainder of the first implanted region 1616. The PNP ESD protection device 1601 in FIGS. 16 and 17 also includes a base B that includes the implanted portion 1629 of the second implanted region 1618, where the implanted portion 1629 includes n-type majority carrier dopants (e.g., phosphorus, etc.) at a dopant concentration greater than the dopant concentration of the remainder of the second implanted region 1618. The PNP ESD protection device 1601 also has an emitter E that includes the implanted portion 1624 of the third implanted region 1620. The implanted portion 1624 of the third implanted region 1620 includes p-type majority carrier dopants at a dopant concentration greater than the dopant concentration of a remainder of the third implanted region 1620. The metallization structure 1608 in this example includes conductive structures 1642, 1652, 1662, 1672 that electrically connect the emitter E and the base B of the PNP transistor ESD protection device 1601 to one another.

The PNP ESD protection device 1601 is fabricated on and/or in the upper second side of the of the N semiconductor layer 1606 which affects the voltage potential distribution inside the device 1600 and its breakdown. The conductive field plate 1630 with tailored overlap distance 1631 counteracts the bottom substrate bias effect and reduces or mitigates the variation in the breakdown voltage. In addition, the STI isolation layer 114 formed between the base and emitter helps control latch-up by increasing the base resistance. In this regard, like the device 100 above (and the NPN example in FIGS. 18 and 19 below), the use of the recessed first STI layer 1614 between the emitter and base in the PNP device 1601 is more effective in controlling the base resistance Rb than just spacing. In addition, the illustrated example ESD protection devices, whether SCR, PNP or NPN, use finger or racetrack configurations or shapes, whether single finger shapes, or multi-finger arrangements. FIG. 17 shows the finger shape for the example PNP ESD protection device 1601, that includes a straight portion 1700 that extends along the third direction Y, as well as a first (e.g., upper) turn portion 1701 at the first end of the finger shape, and a second (e.g., lower) turn portion 1702 at the second end of the finger shape. Like the SCR example in FIGS. 1 and 2 above (and the NPN example in FIGS. 18 and 19 below), the first implanted region 1616 and the second implanted region 1618 extend in the straight portion 1700, as well as around the respective first and second turn portions 1701 and 1702. This feature facilitates uniform base resistance Rb in the corners, which in turn improves the ESD current handling capability, for example, by a factor of 10 in the illustrated implementations.

Figure 18:
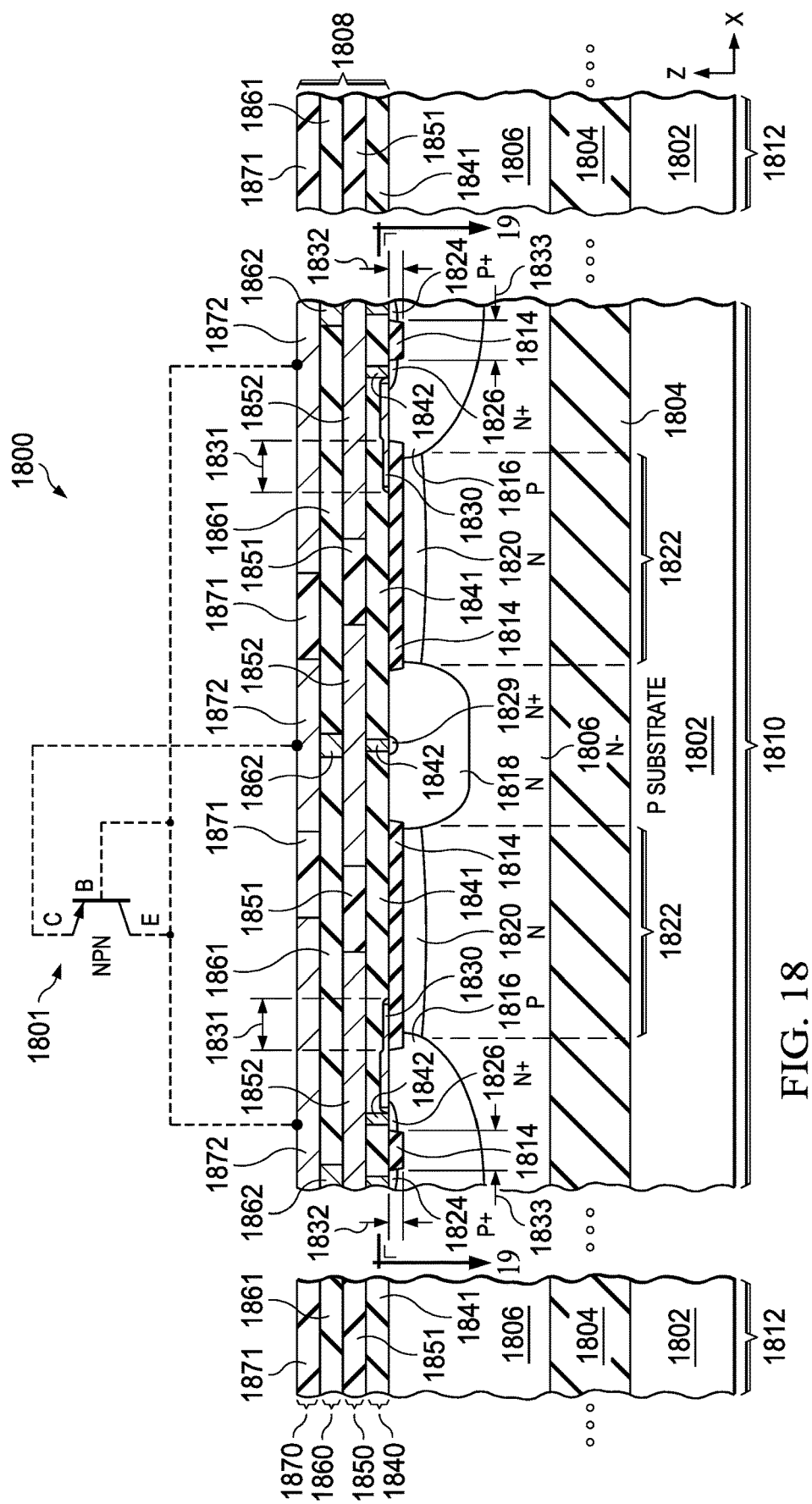
FIG. 18 is a partial sectional side elevation view of another IC with an NPN bipolar transistor ESD protection device.
Figure 19:
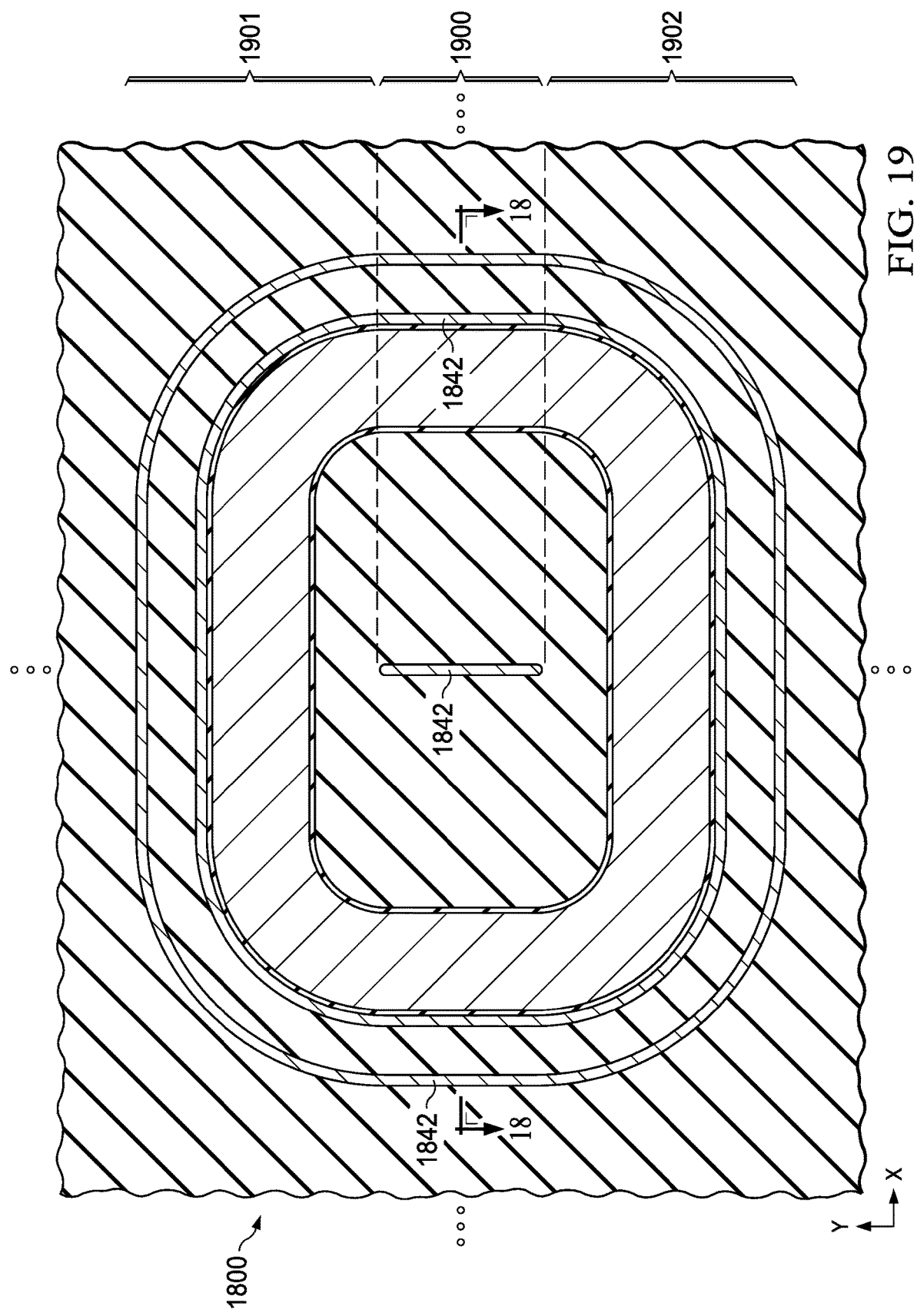
FIG. 19 is a partial sectional top plan view of the NPN ESD protection device taken along line 19-19 in FIG. 18.

FIGS. 18 and 19 show another example electronic device 1800 that includes an NPN bipolar transistor-type ESD protection device 1601. The electronic device 1800 in FIGS. 16 and 17 includes structures, nodes, features, regions, dimensions, and materials 1802, 1804, 1806, 1808, 1810, 1812, 1814, 1816, 1818, 1820, 1822, 1824, 1826, 1829, 1830, 1831, 1832, 1840, 1841, 1842, 1850, 1851, 1852, 1860, 1861, 1862, 1870, 1871, and 1872, that generally correspond to the respective structures, nodes, features, regions, dimensions, and materials 102, 104, 106, 108, 110, 112, 114, 11, 118, 120, 122, 124, 126, 129, 130, 131, 132, 140, 141, 142, 150, 151, 152, 160, 161, 162, 170, 171, and 172 of the electronic device 100 as described in connection with FIGS. 1 and 2 above. FIG. 18 shows a partial sectional side elevation view the electronic device 1800 taken along line 18-18 in FIG. 19, and FIG. 19 shows a partial sectional top plan view of the electronic device 1800 taken along line 19-19 in FIG. 18, including the PMD layer contacts 1842.

The NPN ESD protection device 1801 in FIGS. 18 and 19 has an emitter E that includes a first implanted portion 1826 of the first implanted region 1816. The first implanted portion 1826 includes n-type majority carrier dopants at a dopant concentration greater than the dopant concentration of a remainder of the first implanted region 1816. The ESD protection device 1801 also has a base B with a second implanted portion 1824 of the first implanted region 1816, where the second implanted portion 1824 includes p-type majority carrier dopants at a dopant concentration greater than the dopant concentration of the remainder of the first implanted region 1816. This example also has an NPN transistor collector C with an implanted portion 1829 of the second implanted region 1818. The implanted portion 1829 includes n-type majority carrier dopants at a dopant concentration greater than the dopant concentration of the remainder of the second implanted region 1818. The NPN ESD protection device 1801 in this example also includes a second isolation layer 1814 disposed between the emitter E and the base B along the first direction X. In addition, the metallization structure 1808 of the electronic device 1800 in FIGS. 18 and 19 includes conductive structures 1842, 1852, 1862, 1872 that electrically connect the emitter E and the base B of the NPN transistor 1801 to one another.

Like the SCR and PNP examples above, the NPN ESD protection device 1801 in FIGS. 18 and 19 is fabricated on and/or in the upper second side of the of the N semiconductor layer 1806 which affects the voltage potential distribution inside the device 1800 and its breakdown. The conductive field plate 1830 with tailored overlap distance 1831 counteracts the bottom substrate bias effect and reduces or mitigates the variation in the breakdown voltage. In addition, the STI isolation layer 1814 formed between the base and emitter helps control latch-up by increasing the base resistance. In addition, the use of the recessed first STI layer 1814 between the emitter and base in the NPN device 1801 is more effective in controlling the base resistance Rb than just spacing. The NPN ESD protection device 1801 in certain examples also uses single or multiple finger shapes, as shown in FIG. 19, including a straight portion 1900 extending along the Y direction, a first (e.g., upper) turn portion 1901 at the first end of the finger shape, and a second (e.g., lower) turn portion 1902 at the second end of the finger shape. Like the SCR and PNP examples above, the first implanted region 1816 and the second implanted region 1818 extend in the straight portion 1900, as well as around the respective first and second turn portions 1901 and 1902 to facilitate uniform base resistance Rb in the corners, and to improve the ESD current handling capability.

Figure 20:
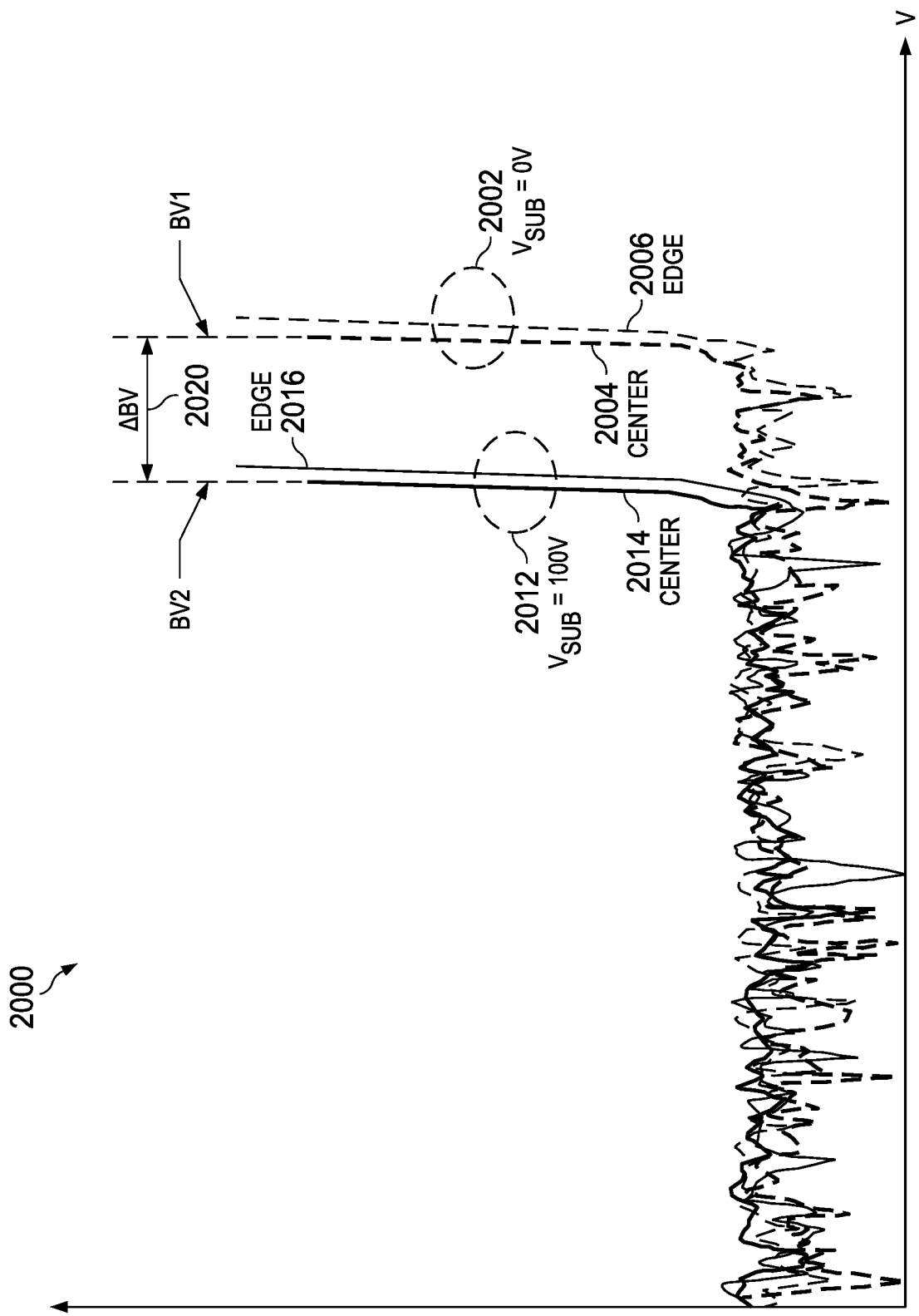
FIG. 20 is a graph that shows comparative protection device center and edge breakdown voltage variation for different substrate voltages in an SOI-based ESD protection device.

FIG. 20 shows a graph 2000 with two sets of comparative center and edge voltage-current (V-I) curves that illustrate handle substrate bias effect on ESD protection device breakdown voltage. The graph 2000 shows a first set of curves 2002 corresponding to ESD protection device current as a function of voltage for zero handle substrate bias voltage (e.g., $V_{SUB}$=0 V), including a curve 2004 showing the device current at the center of the finger structure, and a curve 2006 showing the device current at the edge of the finger structure. In this example, the center of the device breaks down before the edge, and the actual breakdown voltage is shown in the graph 2000 as a first breakdown voltage BV1.

FIG. 20 also shows a second set of curves 2012 corresponding to the ESD protection device current for a non-zero substrate voltage near the rated breakdown voltage of the device (e.g., $V_{SUB}$=100 V for a device with a rated breakdown voltage of 100 V). The second set of curves 2012 includes a curve 2014 showing the device current at the center of the finger structure, and a curve 2016 showing the device current at the edge of the finger structure. The center of the substrate biased ESD protection device also breaks down before the edge, and the breakdown voltage is shown as a second breakdown voltage BV2.

FIG. 20 illustrates the difference between the two breakdown voltages (e.g., BV1–BV2) as the resulting breakdown voltage variation 2020 (labeled ΔBV). The graph 2000 shows that the handle substrate bias voltage condition affects the ESD protection device breakdown voltage. In the illustrated example, changing the handle substrate bias $V_{SUB}$ from 0 V to 100 V changes the breakdown voltage from the initial level BV1=100 V to the lowered second level BV2=80-85 V, for an example breakdown voltage variation 2020 (ΔBV=10-15 V).

Referring also to FIGS. 21-24, the features of the example SCR, PNP and NPN ESD protection devices 101, 1601 and 1801, including the control of the relative sizing of the field plate/isolation layer overlap distance (e.g., 131, 1631, 1831) and the isolation layer thickness (e.g., 132, 1632, 1832). These features can be used to control the breakdown voltage variation 2020 for a given ESD protection device (e.g., 101, 1601 and/or 1801 above), and the breakdown voltage variation 2020 can be further reduced for a given design by selecting the dopant concentration of the third implanted regions (e.g., 120, 1620, 1820) as described above. These features can be employed to advantageously reduce the breakdown voltage variation as a function of the handle substrate bias voltage.

FIGS. 21-24 show the advantages of tailoring the field plate/isolation layer overlap distance (e.g., 131, 1631, 1831 above) according to the isolation layer thickness (e.g., 132, 1632, 1832). FIGS. 21-24 show high voltage ESD event electric potential field line simulations for progressively increased field plate/isolation layer overlap distance 1632 for different implementations of the example PNP ESD protection device 1601 of FIGS. 16 and 17 with a constant isolation layer (e.g., STI) thickness 1632 of approximately 0.6 μm (e.g., region 1620 in FIG. 16 above), the same third implanted region depth of 6 to 7 μm, and the same third implanted region dopant concentration of about 2×10$^{16}$ cm$^{-3}$ at or near the top of the region 1620 beneath the STI isolation layer 1614 (FIG. 16).

Figure 21:
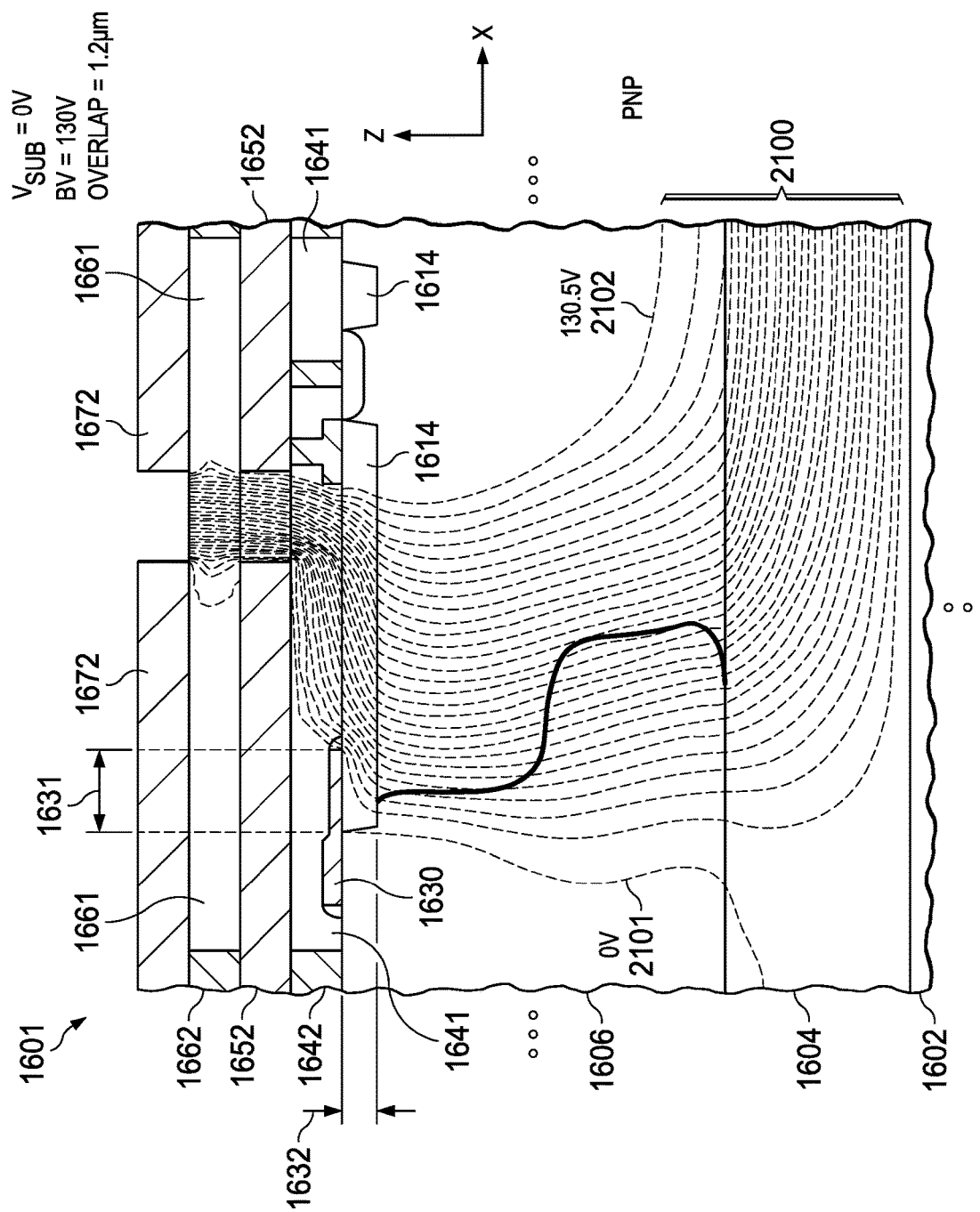
FIG. 21 is a partial sectional side elevation view of electric potential lines in a portion of the PNP ESD protection device of FIGS. 16 and 17 with a first polysilicon field plate/shallow trench isolation (STI) overlap distance and a zero substrate voltage.
Figure 22:
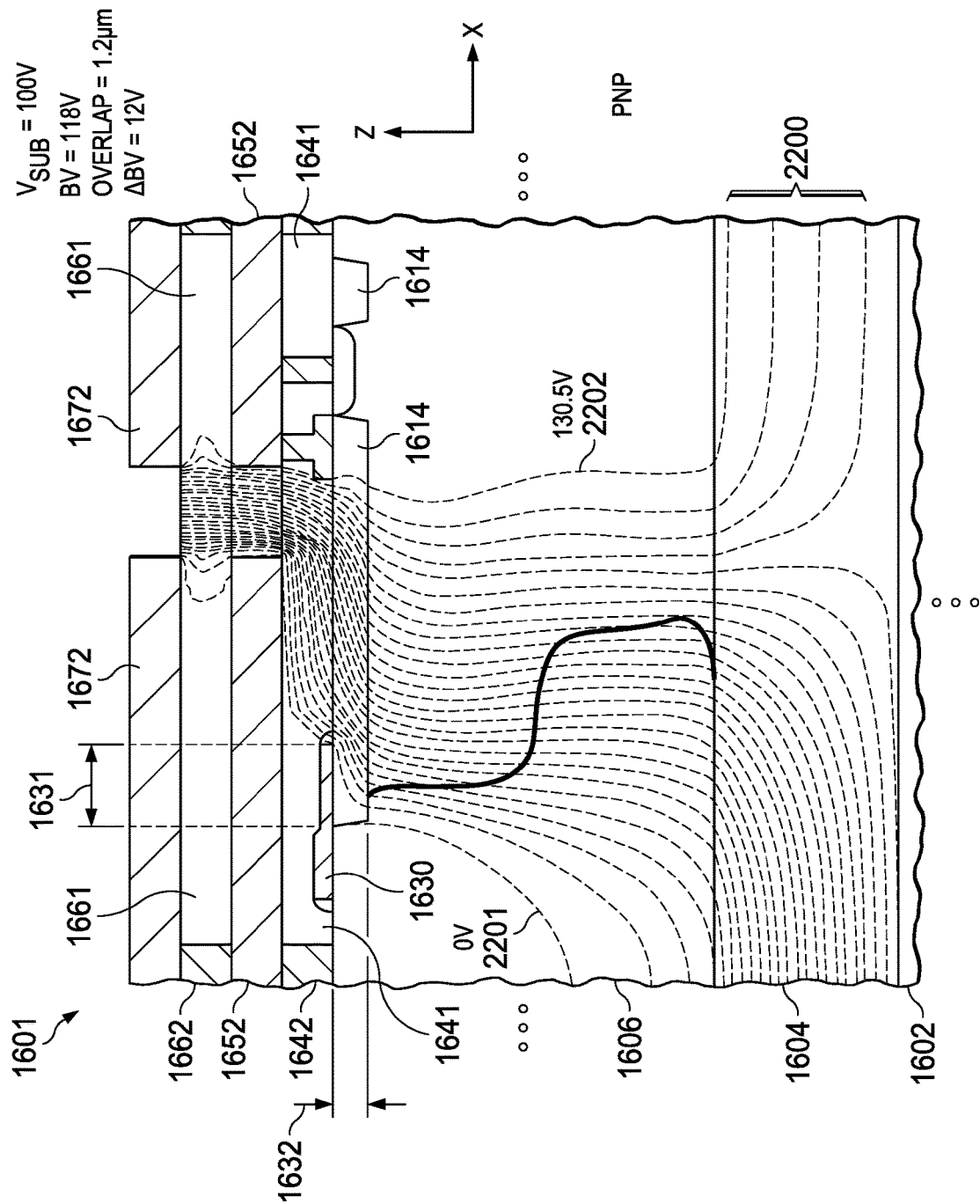
FIG. 22 is a partial sectional side elevation view of electric potential lines a portion of the PNP ESD protection device of FIG. 20 with a positive non-zero substrate voltage.

FIGS. 21 and 22 show example simulated electric field lines in respective unbiased and a biased handle substrate conditions for a PNP ESD protection device 1601. In FIG. 21, the handle substrate bias of the semiconductor substrate 1602 $V_{SUB}$=0 V, and the overlap distance 1631 of the field plate 1630 over the STI insulation layer 1614 is 1.2 μm. FIG. 21 shows example equal potential lines 2100 in a range from a first line 2101 at 0 V to a final line 2102 at 130.5 V, with the lines 2100 showing the field distribution within a portion of the ESD protection device 1601 for the unbiased handle substrate condition, resulting in a simulated breakdown voltage of 130 V. FIG. 22 shows equal potential lines 2200 for the same ESD protection device 1601 with a thickness 1632 of 0.6 μm and an overlap distance 1631 of 1.2 μm, with a handle substrate bias of the semiconductor substrate 1602 $V_{SUB}$=100 V. The set of equal potential lines 2200 in FIG. 22 includes an example first line 2101 corresponding to 0 V, and a final line 2202 corresponding to 130.5 V. At this handle substrate bias level, the device 1601 has a breakdown voltage of 118 V, and the breakdown voltage variation ΔBV=12 V.

Figure 23:
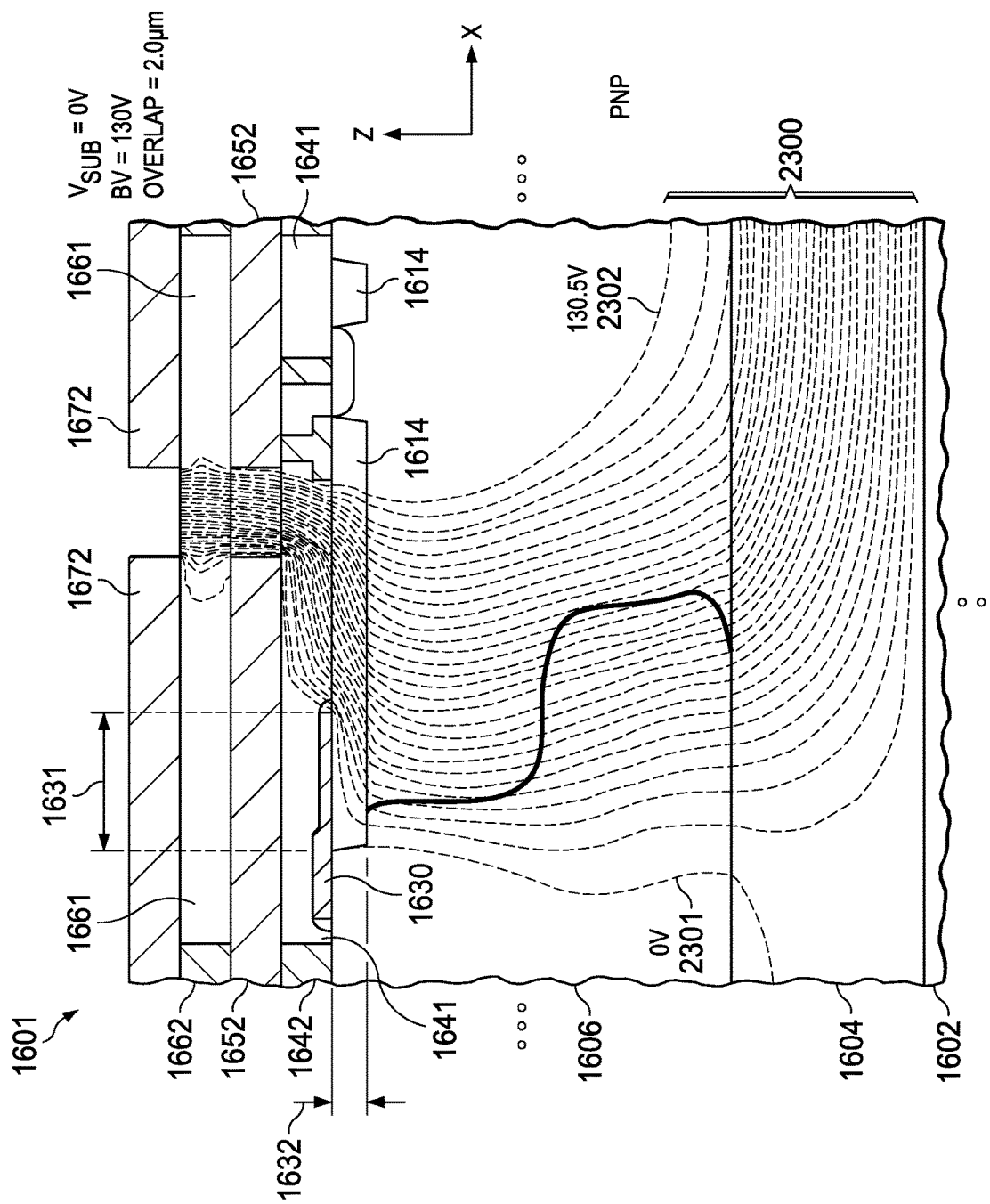
FIG. 23 is a partial sectional side elevation view of electric potential lines in a portion of the PNP ESD protection device of FIGS. 17 and 18 with a longer second polysilicon/STI overlap distance and a zero substrate voltage.
Figure 24:
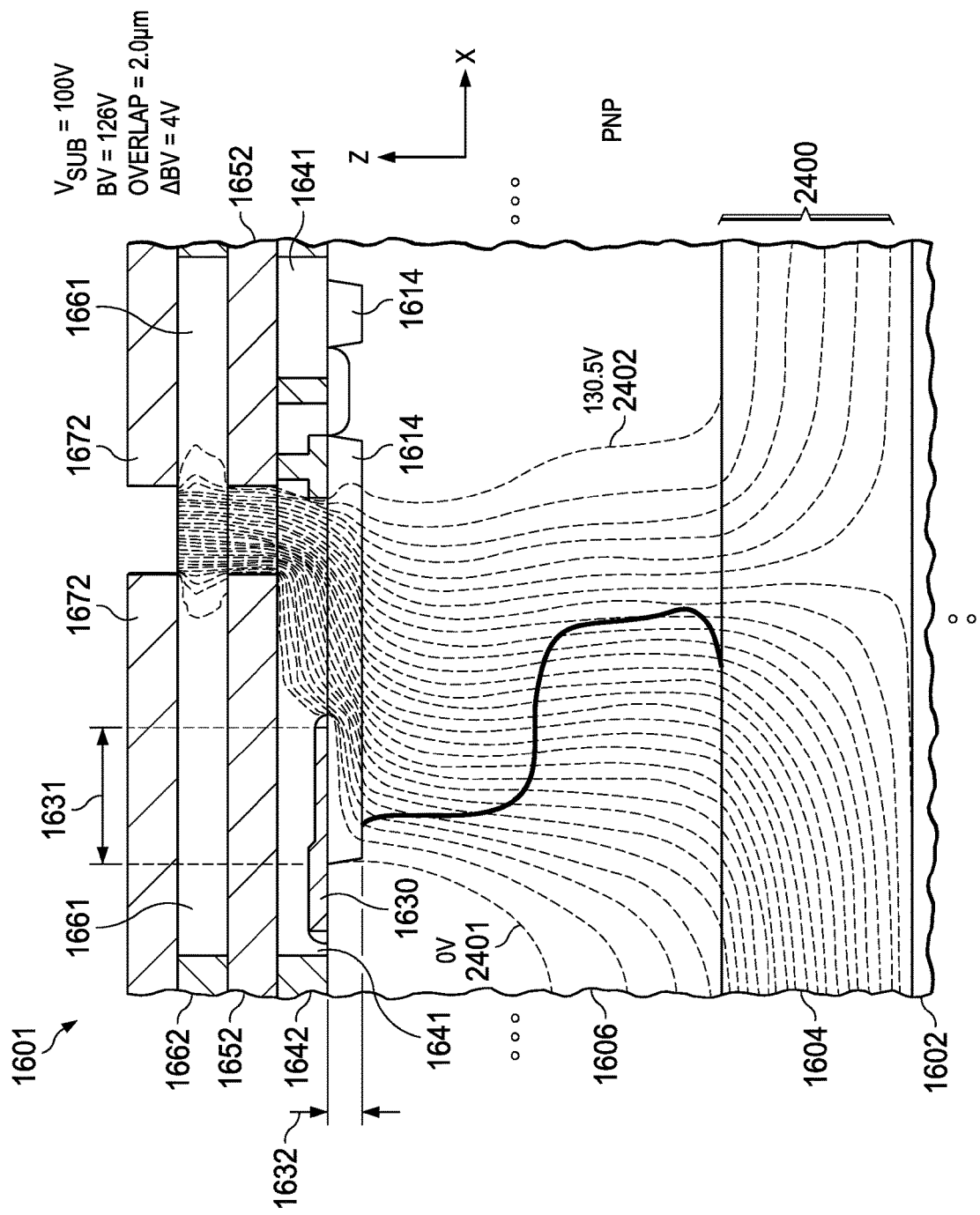
FIG. 24 is a partial sectional side elevation view of electric potential lines a portion of the PNP ESD protection device of FIG. 22 with the positive non-zero substrate voltage.

FIGS. 23 and 24 show further example simulated electric field lines in respective unbiased and a biased handle substrate conditions for a modified PNP ESD protection device 1601 with the overlap distance 1631 increased to 2.0 μm, and all other associated dimensions and dopant concentrations the same as in the simulations of FIGS. 21 and 22 above. FIG. 23 shows the unbiased condition where the handle substrate bias of the semiconductor substrate 1602 $V_{SUB}$=0 V, and illustrates simulated equal potential lines 2300 in a range from a first line 2301 at 0 V to a final line 2302 at 130.5 V in a portion of the ESD protection device 1601 for the unbiased handle substrate condition, resulting in a simulated breakdown voltage of 130 V. For the biased condition, FIG. 24 shows a set of equal potential lines 2400 for the same ESD protection device 1601 with a handle substrate bias of the semiconductor substrate 1602 $V_{SUB}$=100 V, including a first line 2401 corresponding to 0 V, and a final line 2402 corresponding to 130.5 V. At this handle substrate bias in condition, the device 1601 has a breakdown voltage of 126 V, and the significantly reduced breakdown voltage variation ΔBV=4 V. FIGS. 21-24, the control of the relative dimensions 1631 and 1632 can mitigate the breakdown voltage variation ΔBV to facilitate use of predictable ESD protection in integrated circuits or other electronic devices.

Figure 25:
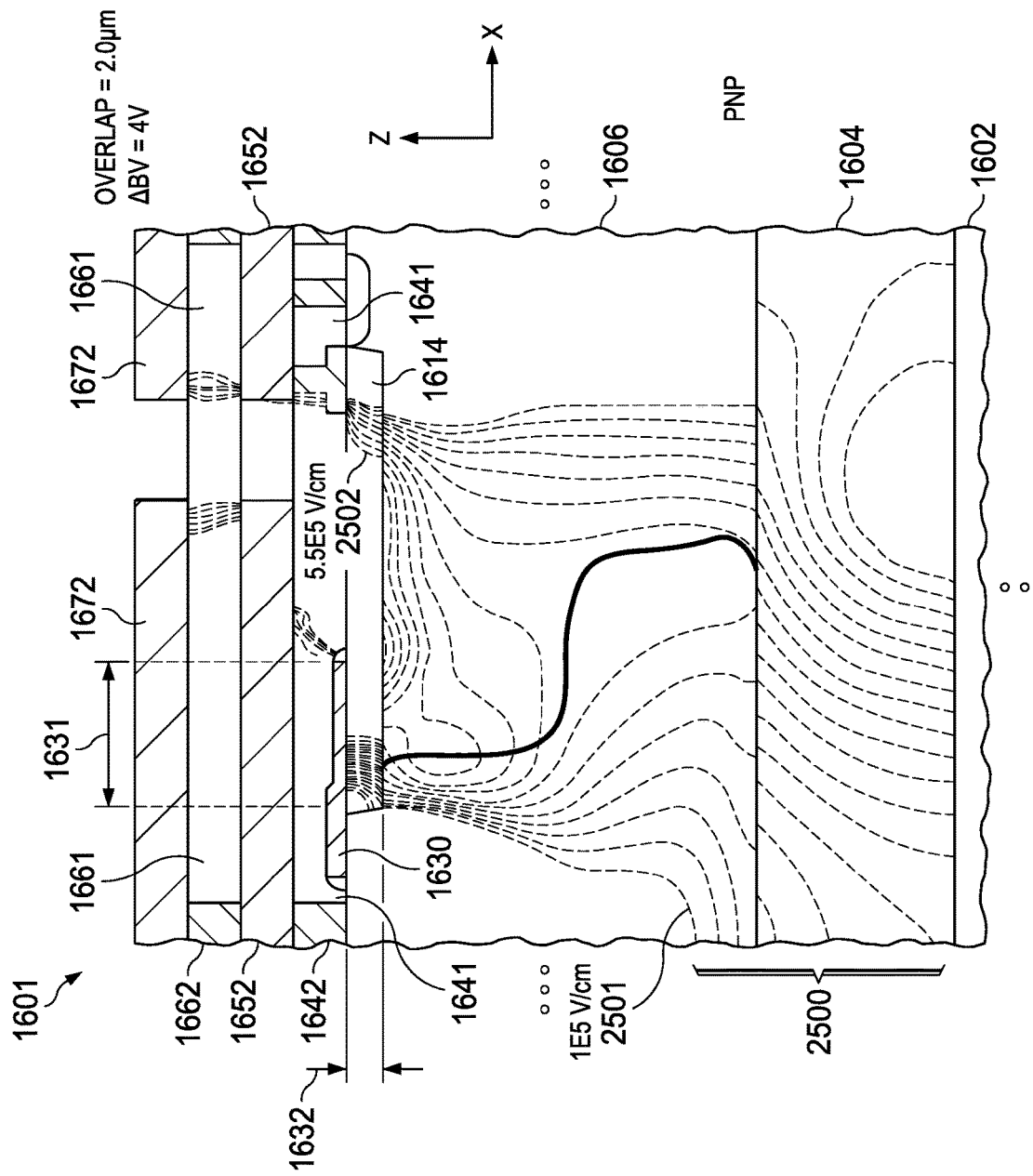
FIG. 25 is a partial sectional side elevation view of electric field strength regions in a portion of the PNP ESD protection device of FIGS. 23 and 24 with the second polysilicon/STI overlap distance and the positive non-zero substrate voltage.
Figure 26:
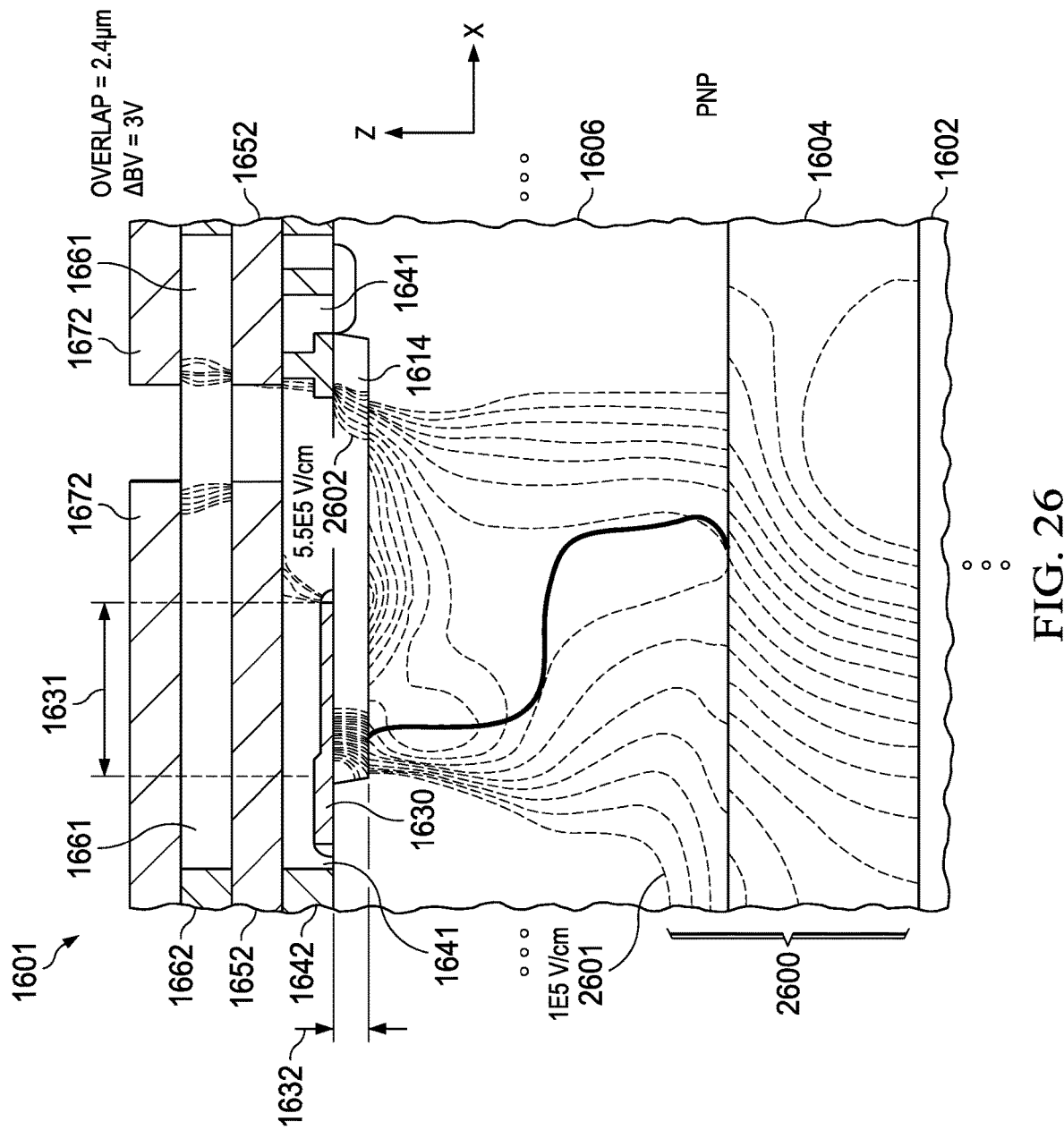
FIG. 26 is a partial sectional side elevation view of electric field strength regions in a portion of the PNP ESD protection device with a still longer third polysilicon/STI overlap distance and the positive non-zero substrate voltage.

FIGS. 25 and 26 show further examples of tailoring the overlap distance 1631 of the field plate 1830 over the STI insulation layer 1614 in different implementations of the PNP ESD protection device 1601 of FIGS. 16 and 17. FIG. 25 shows a set of electric field strength regions 2500, including a first region 2501 corresponding to an electric field strength of 1×10$^5$ V/cm and a final region 2502 corresponding to an electric field strength of 5.5×10$^5$ V/cm for an overlap distance 1631 of 2.0 μm at a handle substrate bias voltage of 100 V, which results in a breakdown voltage variation ΔBV=4 V compared with an unbiased handle substrate. FIG. 26 shows a set of electric field strength regions 2600, including a first region 2601 corresponding to an electric field strength of 1×10$^5$ V/cm and a final region 2602 corresponding to an electric field strength of 5.5×10$^5$ V/cm for an increased field plate/insulation layer overlap distance 1631 of 2.4 μm at a handle substrate bias voltage of $V_{SUB}$=100 V. The increased overlap distance 1631 in this example results in a reduced breakdown voltage variation ΔBV=3 V compared with an unbiased handle substrate.

Figure 27:
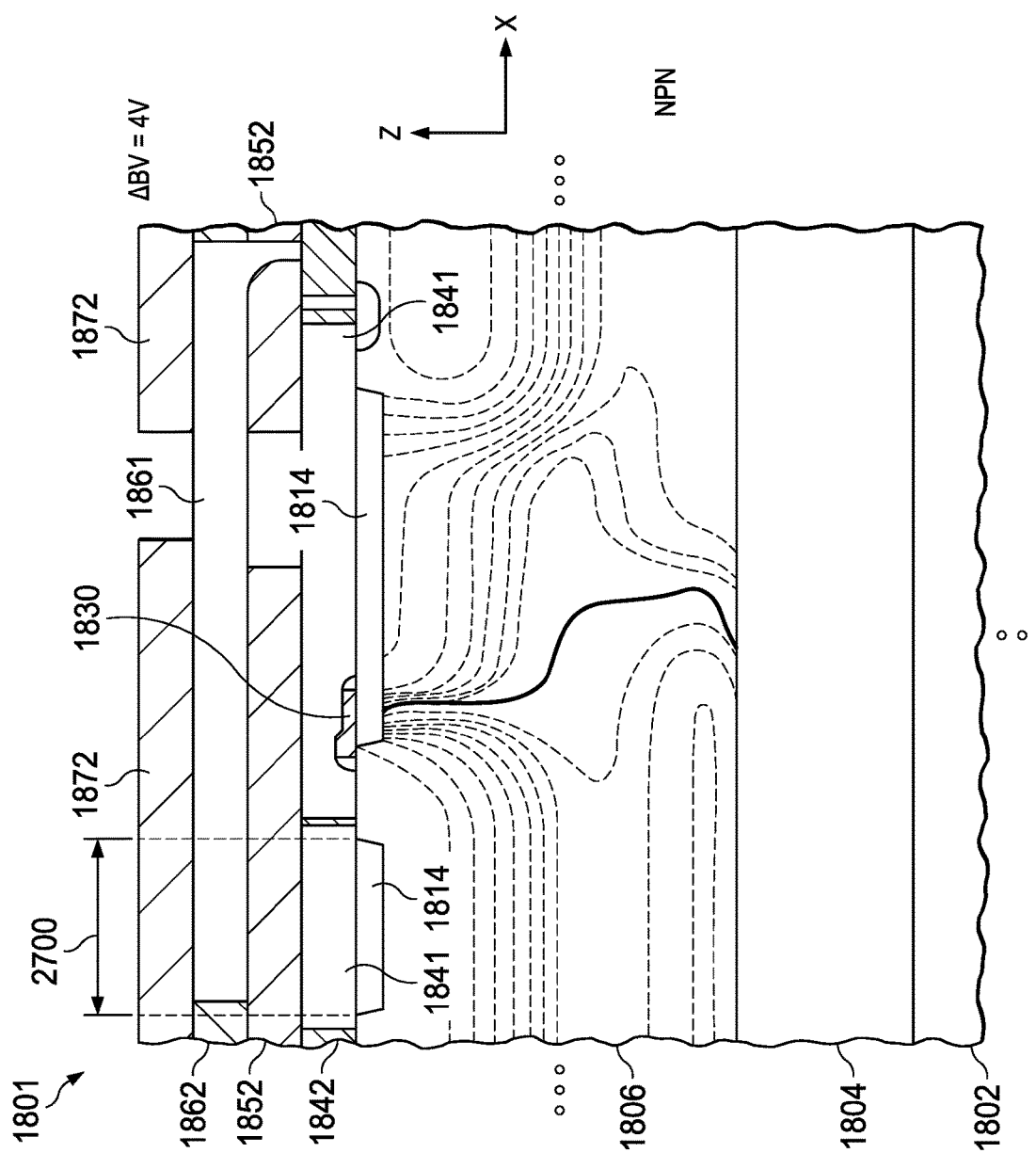
FIG. 27 is a partial sectional side elevation view of an example of the NPN ESD protection device of FIGS. 18 and 19 with a first emitter/base STI spacing distance.
Figure 28:
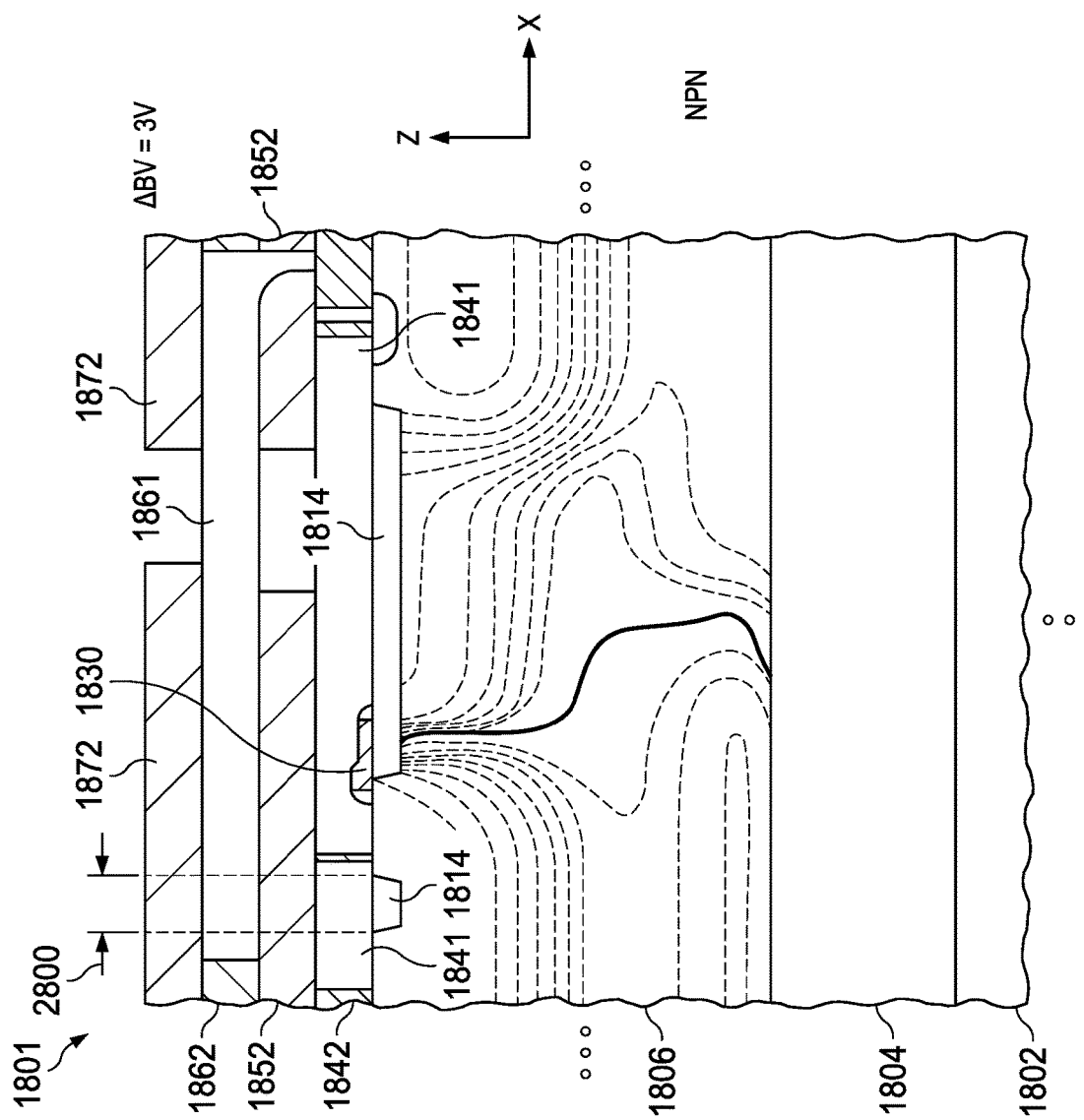
FIG. 28 is a partial sectional side elevation view of another example of the NPN ESD protection device of FIGS. 18 and 19 with a smaller second emitter/base STI spacing distance.
Figure 29:
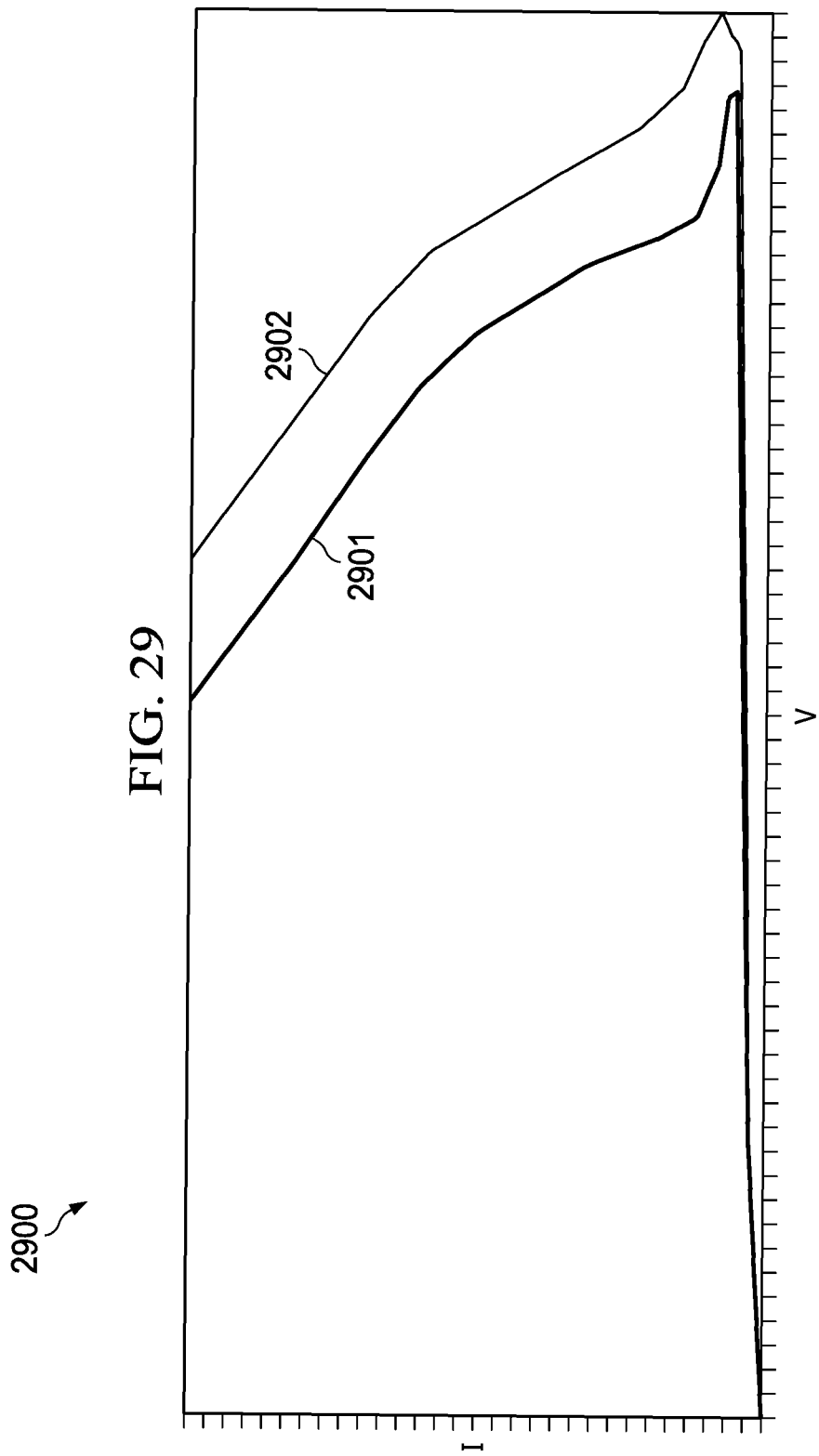
FIG. 29 is a graph that shows comparative current/voltage curves for the NPN ESD protection devices of FIGS. 27 and 28.

Referring also to FIGS. 27-29, FIGS. 27 and 28 show example simulated electric fields in a portion of the NPN ESD protection device 1801 of FIGS. 18 and 19 above for two different values of the emitter/base STI spacing distance (e.g., the lateral length 1833 of the second isolation layer 1814 in FIG. 18 above). The NPN ESD protection device 1801 of FIG. 27 is implemented with a first emitter/base STI spacing distance 2700 of 4 μm. The implementation of the ESD protection device 1801 in FIG. 28 has a smaller second emitter/base STI spacing distance 2800 of 1 μm. FIG. 29 shows a graph 2900, including comparative current/voltage curves for the NPN ESD protection devices of FIGS. 27 and 28. The first curve 2901 corresponds to the snap-back performance of the NPN ESD protection device 1801 of FIG. 27 with the emitter/base STI spacing distance 2700 of 4 μm, and the second curve 2902 shows the snap-back performance of the NPN ESD protection device 1801 of FIG. 28 with the shortened emitter/base STI spacing distance 2700 of 1 μm. The example simulations of FIGS. 27-29 show that the ESD protection device snap-back can be adjusted by design of the spacing distance 1831 in FIG. 18 (e.g., and the second insulation layer lateral distance 131 in the SCR ESD protection device 101 of FIG. 1 above). The distances 131 and 1831 can be set to suitable values to shorten the snap-back to facilitate higher ESD current handling capability by improving the ability of the device to handle much higher current before thermal failure. In certain implementations, the second insulation layer lateral distances 131 and 1831 can be in the range of 4.0 μm to 8.0 μm.

Figure 30:
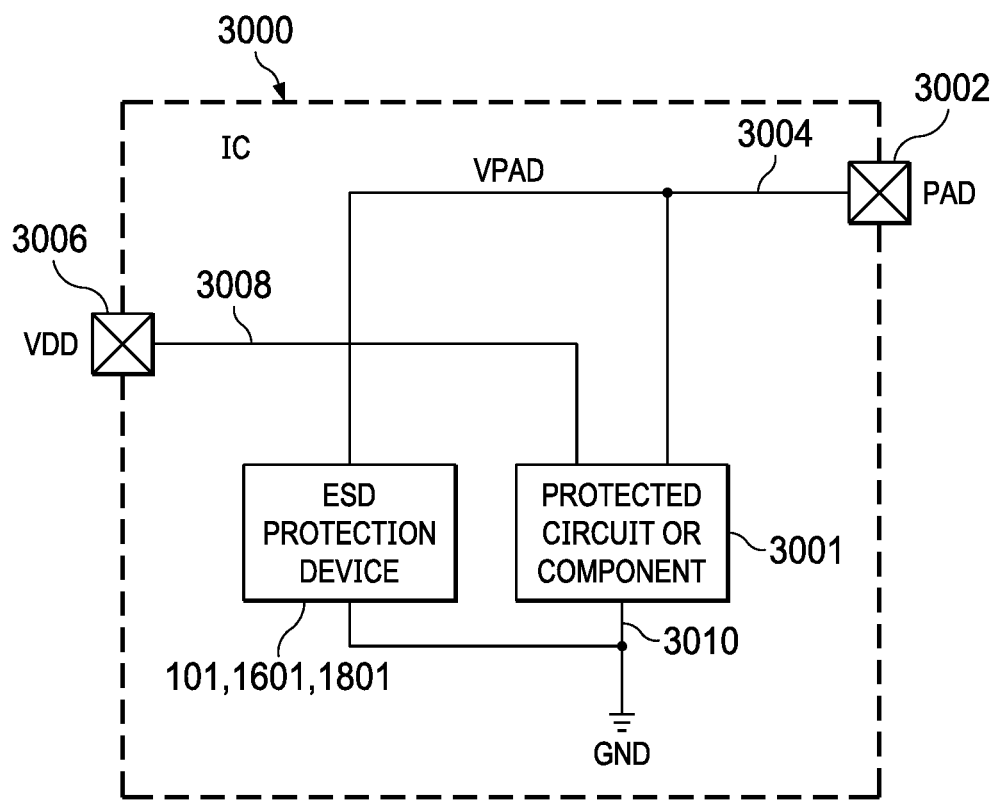
FIG. 30 is a schematic diagram of an integrated circuit with an ESD protection device.

FIG. 30 shows an example IC electronic device 3000 with an ESD protection device as described above (e.g., and SCR ESD protection device 101, a PNP ESD protection device 1601, and NPN ESD protection device 1801, etc.). The IC 3000 also includes a protected circuit or component 3001 connected between a protected pad 3002 (e.g., IC terminal, pin, pad, etc.) and an associated protected internal node 3004 and a reference voltage (e.g., GND). The IC 3000 also includes a power pad 3006 (e.g., to receive a supply voltage VDD), and an internal node 3008 connects the supply voltage from the power pad 3006 to the protected circuit or component 3001. In this example, the protected circuit or component 3001 is connected between the protected pad 3002 (e.g., the protected node 3004) and a reference node 3010 (GND), and the ESD protection device 101, 1601, 1801 is connected in parallel with the protected circuit or component 3001. In this example, the electronic device 3000 is an integrated circuit IC 3000 with the protected circuit or component 3001 connected to an externally accessible terminal or pad 3002, and wherein the ESD protection device 101, 1601, 1801 is electrically connected to the externally accessible terminal or pad 3002 of the IC 3000. ESD protection device 101, 1601, 1801 protects the circuit or component 3001 against ESD events associated with the externally accessible electrically conductive pad structure 3002, for example, when the protected pad is soldered to a host printed circuit board (PCB) or otherwise subject to hot-plug surges, switching noise or other transient voltage conditions. In steady state operation, with a supply voltage provided to the VDD pad 3006, voltage levels at the protected pad 3002 below the breakdown voltage rating of the ESD protection device 101, 1601, 1801 will not trigger conduction by the ESD protection device 101, 1601, 1801, and the protected circuit or component 3001 operates in a normal designed fashion. If an ESD event occurs at the protected pad 3002, the associated pad voltage VPAD rises quickly, for example, with a rise time of approximately 10 ns or less in a 2000 V human body model (HBM) ESD test event, which causes voltage breakdown within the ESD protection device 101, 1601, 1801, causing the ESD event current to conduct through the protection device 101, 1601, 1801, thereby preventing excessive current flow in the protected circuit or component 3001.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. An electronic device, comprising:
   a silicon-on-insulator (SOI) structure including a semiconductor layer; and
   an electrostatic discharge (ESD) protection device, including:
      a first implanted region disposed in the semiconductor layer, the first implanted region including majority carrier dopants of a first type,
      a second implanted region disposed in the semiconductor layer and spaced apart from the first implanted region along a first direction, the second implanted region including majority carrier dopants of a second type,
      a third implanted region disposed in the semiconductor layer, the third implanted region extending along the first direction from the first implanted region to the second implanted region, the third implanted region including majority carrier dopants of the second type,
      an isolation layer extending in a trench in the semiconductor layer, the isolation layer extending along the first direction from the first implanted region, and having a thickness along a second direction, the first and second directions being orthogonal to one another, and
a conductive field plate disposed over the semiconductor layer, the conductive field plate extending along the first direction over a portion of the first implanted region, and extending past the first implanted region and over a portion of the isolation layer by an overlap distance, the overlap distance being 3.5 to 5.0 times the thickness of the isolation layer.

2. The electronic device of claim 1, wherein the third implanted region includes majority carrier dopants of the second type at a dopant concentration of $5 \times 10^{15}$ cm$^{-3}$ to $1 \times 10^{17}$ cm$^{-3}$.

3. The electronic device of claim 1,
wherein the ESD protection device has a finger shape with first and second ends, the finger shape including:
a straight portion extending along a third direction, the third direction being orthogonal to the first and second directions,
a first turn portion at the first end of the finger shape, and
a second turn portion at the second end of the finger shape; and
wherein the first implanted region and the second implanted region extend in the straight portion and in the first and second turn portions of the finger shape.

4. The electronic device of claim 3, wherein the ESD protection device further includes a second isolation layer extending in a second trench in the semiconductor layer in the first implanted region and spaced apart from the isolation layer, the second isolation layer having a length along the first direction of 4 μm to 8 μm.

5. The electronic device of claim 4, wherein the ESD protection device is a silicon-controlled rectifier (SCR), the SCR comprising:
a cathode, including a first implanted portion of the first implanted region, the first implanted portion of the first implanted region including majority carrier dopants of the second type at a dopant concentration greater than a dopant concentration of a remainder of the first implanted region;
a gate, including a second implanted portion of the first implanted region, the second implanted portion of the first implanted region including majority carrier dopants of the first type at a dopant concentration greater than a dopant concentration of the remainder of the first implanted region; and
an anode, including an implanted portion of the second implanted region, the implanted portion of the second implanted region including majority carrier dopants of the first type at a dopant concentration greater than a dopant concentration of a remainder of the second implanted region;
the electronic device further comprising a metallization structure, including conductive structures that electrically connect the cathode and the gate of the SCR to one another.

6. The electronic device of claim 4, wherein the ESD protection device is an NPN transistor, the NPN transistor comprising:
an emitter, including a first implanted portion of the first implanted region, the first implanted portion of the first implanted region including majority carrier dopants of the second type at a dopant concentration greater than a dopant concentration of a remainder of the first implanted region;
a base, including a second implanted portion of the first implanted region, the second implanted portion of the first implanted region including majority carrier dopants of the first type at a dopant concentration greater than a dopant concentration of the remainder of the first implanted region; and
a collector, including an implanted portion of the second implanted region, the implanted portion of the second implanted region including majority carrier dopants of the second type at a dopant concentration greater than a dopant concentration of a remainder of the second implanted region;
the second isolation layer being disposed between the emitter and the base of the NPN transistor along the first direction;
the electronic device further comprising a metallization structure, including conductive structures that electrically connect the emitter and the base of the NPN transistor to one another.

7. The electronic device of claim 4, wherein the third implanted region includes majority carrier dopants of the second type at a dopant concentration of $5 \times 10^{15}$ cm$^{-3}$ to $1 \times 10^{17}$ cm$^{-3}$.

8. The electronic device of claim 1, wherein the ESD protection device further includes a second isolation layer extending in a second trench in the second side of the semiconductor layer in the first implanted region and spaced apart from the isolation layer, the second isolation layer having a length along the first direction of 4 μm to 8 μm.

9. The electronic device of claim 8, wherein the ESD protection device is a silicon-controlled rectifier (SCR), the SCR comprising:
a cathode, including a first implanted portion of the first implanted region, the first implanted portion of the first implanted region including majority carrier dopants of the second type at a dopant concentration greater than a dopant concentration of a remainder of the first implanted region;
a gate, including a second implanted portion of the first implanted region, the second implanted portion of the first implanted region including majority carrier dopants of the first type at a dopant concentration greater than a dopant concentration of the remainder of the first implanted region; and
an anode, including an implanted portion of the second implanted region, the implanted portion of the second implanted region including majority carrier dopants of the first type at a dopant concentration greater than a dopant concentration of a remainder of the second implanted region;
the electronic device further comprising a metallization structure, including conductive structures that electrically connect the cathode and the gate of the SCR to one another.

10. The electronic device of claim 8, wherein the ESD protection device is an NPN transistor, the NPN transistor comprising:
an emitter, including a first implanted portion of the first implanted region, the first implanted portion of the first implanted region including majority carrier dopants of the second type at a dopant concentration greater than a dopant concentration of a remainder of the first implanted region;
a base, including a second implanted portion of the first implanted region, the second implanted portion of the first implanted region including majority carrier dopants of the first type at a dopant concentration greater than a dopant concentration of the remainder of the first implanted region; and a collector, including an implanted portion of the second implanted region, the implanted portion of the second implanted region including majority carrier dopants of the second type at a dopant concentration greater than a dopant concentration of a remainder of the second implanted region;

the electronic device further comprising a metallization structure, including conductive structures that electrically connect the emitter and the base of the NPN transistor to one another.

11. The electronic device of claim 1, wherein the electronic device is an integrated circuit (IC), further including a protected circuit or component connected to an externally accessible terminal or pad of the IC, wherein the ESD protection device is electrically connected to the externally accessible terminal or pad of the IC.

12. The electronic device of claim 1, wherein the conductive field plate includes polysilicon.

13. An electronic device, comprising:
a silicon-on-insulator (SOI) structure including a semiconductor layer; and
an electrostatic discharge (ESD) protection device, including:
a first implanted region disposed in the semiconductor layer, the first implanted region including majority carrier dopants of a first type,
a second implanted region disposed in the semiconductor layer and spaced apart from the first implanted region along a first direction, the second implanted region including majority carrier dopants of a second type,
a third implanted region disposed in the semiconductor layer, the third implanted region extending along the first direction from the first implanted region to the second implanted region, the third implanted region including majority carrier dopants of the second type,
an isolation layer extending in a trench in the semiconductor layer, the isolation layer extending along the first direction from the first implanted region, and having a thickness along a second direction, the first and second directions being orthogonal to one another, and
a conductive field plate disposed over the semiconductor layer, the conductive field plate extending along the first direction over a portion of the first implanted region, and extending past the first implanted region and over a portion of the isolation layer by an overlap distance, the overlap distance being 3.5 to 5.0 times the thickness of the isolation layer, wherein the ESD protection device is a silicon-controlled rectifier (SCR), the SCR comprising:
a cathode, including a first implanted portion of the first implanted region, the first implanted portion of the first implanted region including majority carrier dopants of the second type at a dopant concentration greater than a dopant concentration of a remainder of the first implanted region;
a gate, including a second implanted portion of the first implanted region, the second implanted portion of the first implanted region including majority carrier dopants of the first type at a dopant concentration greater than a dopant concentration of the remainder of the first implanted region; and
an anode, including an implanted portion of the second implanted region, the implanted portion of the second implanted region including majority carrier dopants of the first type at a dopant concentration greater than a dopant concentration of a remainder of the second implanted region;

the electronic device further comprising a metallization structure, including conductive structures that electrically connect the cathode and the gate of the SCR to one another.

14. An electronic device, comprising:
a silicon-on-insulator (SOI) structure including a semiconductor layer; and
an electrostatic discharge (ESD) protection device, including:
a first implanted region disposed in the semiconductor layer, the first implanted region including majority carrier dopants of a first type,
a second implanted region disposed in the semiconductor layer and spaced apart from the first implanted region along a first direction, the second implanted region including majority carrier dopants of a second type,
a third implanted region disposed in the semiconductor layer, the third implanted region extending along the first direction from the first implanted region to the second implanted region, the third implanted region including majority carrier dopants of the second type,
an isolation layer extending in a trench in the semiconductor layer, the isolation layer extending along the first direction from the first implanted region, and having a thickness along a second direction, the first and second directions being orthogonal to one another, and
a conductive field plate disposed over the semiconductor layer, the conductive field plate extending along the first direction over a portion of the first implanted region, and extending past the first implanted region and over a portion of the isolation layer by an overlap distance, the overlap distance being 3.5 to 5.0 times the thickness of the isolation layer, wherein the ESD protection device is an NPN transistor, the NPN transistor comprising:
an emitter, including a first implanted portion of the first implanted region, the first implanted portion of the first implanted region including majority carrier dopants of the second type at a dopant concentration greater than a dopant concentration of a remainder of the first implanted region;
a base, including a second implanted portion of the first implanted region, the second implanted portion of the first implanted region including majority carrier dopants of the first type at a dopant concentration greater than a dopant concentration of the remainder of the first implanted region; and
a collector, including an implanted portion of the second implanted region, the implanted portion of the second implanted region including majority carrier dopants of the second type at a dopant concentration greater than a dopant concentration of a remainder of the second implanted region;
the electronic device further comprising a metallization structure, including conductive structures that electrically connect the emitter and the base of the NPN transistor to one another.

15. An electronic device, comprising:
a silicon-on-insulator (SOI) structure including a semiconductor layer; and
an electrostatic discharge (ESD) protection device, including:

a first implanted region disposed in the semiconductor layer, the first implanted region including majority carrier dopants of a first type, a second implanted region disposed in the semiconductor layer and spaced apart from the first implanted region along a first direction, the second implanted region including majority carrier dopants of a second type, a third implanted region disposed in the semiconductor layer, the third implanted region extending along the first direction from the first implanted region to the second implanted region, the third implanted region including majority carrier dopants of the second type, an isolation layer extending in a trench in the semiconductor layer, the isolation layer extending along the first direction from the first implanted region, and having a thickness along a second direction, the first and second directions being orthogonal to one another, and a conductive field plate disposed over the semiconductor layer, the conductive field plate extending along the first direction over a portion of the first implanted region, and extending past the first implanted region and over a portion of the isolation layer by an overlap distance, the overlap distance being 3.5 to 5.0 times the thickness of the isolation layer, wherein the ESD protection device is a PNP transistor, the PNP transistor comprising:

a collector, including an implanted portion of the first implanted region, the implanted portion of the first implanted region including majority carrier dopants of the first type at a dopant concentration greater than a dopant concentration of the remainder of the first implanted region;

a base, including an implanted portion of the second implanted region, the implanted portion of the second implanted region including majority carrier dopants of the second type at a dopant concentration greater than a dopant concentration of a remainder of the second implanted region; and an emitter, including an implanted portion of the third implanted region, the implanted portion of the third implanted region including majority carrier dopants of the first type at a dopant concentration greater than a dopant concentration of a remainder of the third implanted region;

the electronic device further comprising a metallization structure, including conductive structures that electrically connect the emitter and the base of the PNP transistor to one another.

16. An electronic device, comprising:
a silicon-on-insulator (SOI) structure, including:
a semiconductor substrate, including opposite first and second sides,
an insulator layer, including opposite first and second sides, the first side of the insulator layer disposed along the second side of the semiconductor substrate, and
a semiconductor layer, including opposite first and second sides, the first side of the semiconductor layer disposed along the second side of the insulator layer; and
an electrostatic discharge (ESD) protection device, including:
a first implanted region disposed along a first portion of the second side of the semiconductor layer, the first implanted region including majority carrier dopants of a first type,
a second implanted region disposed along a second portion of the second side of the semiconductor layer and spaced apart from the first implanted region along a first direction, the second implanted region including majority carrier dopants of a second type,
a third implanted region disposed along a third portion of the second side of the semiconductor layer, the third implanted region extending along the first direction from the first implanted region to the second implanted region, the third implanted region including majority carrier dopants of the second type,
an isolation layer extending in a trench in the second side of the semiconductor layer, the isolation layer extending along the first direction from the first implanted region, and having a thickness along a second direction, the first and second directions being orthogonal to one another, and
a conductive field plate disposed over part of the second side of the semiconductor layer, the conductive field plate extending along the first direction over a portion of the first implanted region, and extending past the first implanted region and over a portion of the isolation layer;
the ESD protection device having a finger shape with first and second ends, the finger shape including:
a straight portion extending along a third direction, the third direction being orthogonal to the first and second directions,
a first turn portion at the first end of the finger shape, and
a second turn portion at the second end of the finger shape; and
the first implanted region and the second implanted region extending in the straight portion and in the first and second turn portions of the finger shape.

17. The electronic device of claim 16, wherein the ESD protection device further includes a second isolation layer extending in a second trench in the second side of the semiconductor layer in the first implanted region and spaced apart from the isolation layer, the second isolation layer having a length along the first direction of 4 µm to 8 µm.

18. The electronic device of claim 16, wherein the electronic device is an integrated circuit (IC), further including a protected circuit or component connected to an externally accessible terminal or pad of the IC, wherein the ESD protection device is electrically connected to the externally accessible terminal or pad of the IC.

19. An electronic device, comprising:
a silicon-on-insulator (SOI) structure, including a semiconductor layer; and
an electrostatic discharge (ESD) protection device, including:
a first implanted region disposed in the semiconductor layer, the first implanted region including majority carrier dopants of a first type,
a second implanted region disposed in the semiconductor layer and spaced apart from the first implanted region along a first direction, the second implanted region including majority carrier dopants of a second type,
a third implanted region disposed in the semiconductor layer, the third implanted region extending along the first direction from the first implanted region to the second implanted region, the third implanted region including majority carrier dopants of the second type, a first isolation layer extending in a trench in the semiconductor layer, the first isolation layer extending along the first direction from the first implanted region, and having a thickness along a second direction, the first and second directions being orthogonal to one another, a conductive field plate disposed over the semiconductor layer, the conductive field plate extending along the first direction over a portion of the first implanted region, and extending past the first implanted region and over a portion of the first isolation layer, and a second isolation layer extending in a second trench in the semiconductor layer in the first implanted region and spaced apart from the first isolation layer, the second isolation layer extending from a first implanted portion of the first implanted region to a second implanted portion of the first implanted region, the first implanted portion including majority carrier dopants of the first type and the second implanted portion including majority carrier dopants of the second type.

20. The electronic device of claim 19, wherein:

the second isolation layer has a length along the first direction of 4 μm to 8 μm; and the conductive field plate extends over the portion of the first isolation layer by an overlap distance of 3.5 to 5.0 times the thickness of the first isolation layer.

\* \* \* \* \*